United States Patent
Kaneko et al.

(10) Patent No.: US 10,943,857 B2
(45) Date of Patent: Mar. 9, 2021

(54) SUBSTRATE WITH MULTI-LAYER RESIN STRUCTURE AND SEMICONDUCTOR DEVICE INCLUDING THE SUBSTRATE

(71) Applicant: SHINKO ELECTRIC INDUSTRIES CO., LTD., Nagano (JP)

(72) Inventors: Kentaro Kaneko, Nagano (JP); Harunobu Sato, Nagano (JP); Tsukasa Nakanishi, Nagano (JP); Junichi Nakamura, Nagano (JP); Koji Watanabe, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 107 days.

(21) Appl. No.: 16/051,878

(22) Filed: Aug. 1, 2018

(65) Prior Publication Data
US 2019/0088578 A1 Mar. 21, 2019

(30) Foreign Application Priority Data
Sep. 20, 2017 (JP) .............................. JP2017-180608

(51) Int. Cl.
| | |
|---|---|
| *H01L 23/495* | (2006.01) |
| *H01L 21/48* | (2006.01) |
| *H01L 23/00* | (2006.01) |
| *H01L 21/683* | (2006.01) |
| *H01L 23/31* | (2006.01) |

(52) U.S. Cl.
CPC ...... *H01L 23/49586* (2013.01); *H01L 21/481* (2013.01); *H01L 21/4821* (2013.01); *H01L 21/4828* (2013.01); *H01L 21/4839* (2013.01); *H01L 21/4842* (2013.01); *H01L 21/6835* (2013.01); *H01L 23/4951* (2013.01); *H01L 23/49513* (2013.01); *H01L 23/49541* (2013.01);
(Continued)

(58) Field of Classification Search
CPC ............... H01L 23/49586; H01L 23/50; H01L 23/49582; H01L 23/49548; H01L 23/49541; H01L 23/4951; H01L 23/49513; H01L 21/4821; H01L 21/4828; H01L 21/6835; H01L 21/4842; H01L 21/4839; H01L 21/481
See application file for complete search history.

(56) References Cited

U.S. PATENT DOCUMENTS 7,728,440 B2 * 6/2010 Honda ................. H01L 21/563
257/704
8,535,987 B2 9/2013 Maniwa et al.
(Continued)

FOREIGN PATENT DOCUMENTS

JP 2010-238694 10/2010

*Primary Examiner* — Stephen M Bradley
*Assistant Examiner* — Gustavo G Ramallo
(74) *Attorney, Agent, or Firm* — IPUSA, PLLC

(57) ABSTRACT

A substrate for semiconductor elements includes a terminal part including a first surface, a second surface opposite to the first surface, and side surfaces joining the first surface and the second surface, and a resin part covering the side surfaces and exposing the first surface of the terminal part. The resin part has a multi-layer structure including a first resin and a second resin, and the first resin is provided in contact with the side surfaces of the terminal part. The first resin and the second resin include a filler, and an amount of the filler included in the first resin is smaller than an amount of the filler included in the second resin.

20 Claims, 23 Drawing Sheets

(52) U.S. Cl.
CPC .. *H01L 23/49548* (2013.01); *H01L 23/49558* (2013.01); *H01L 23/49582* (2013.01); *H01L 24/16* (2013.01); *H01L 24/32* (2013.01); *H01L 24/48* (2013.01); *H01L 24/73* (2013.01); *H01L 23/3107* (2013.01); *H01L 2221/68345* (2013.01); *H01L 2221/68381* (2013.01); *H01L 2224/16245* (2013.01); *H01L 2224/16258* (2013.01); *H01L 2224/29294* (2013.01); *H01L 2224/29339* (2013.01); *H01L 2224/32245* (2013.01); *H01L 2224/45144* (2013.01); *H01L 2224/45147* (2013.01); *H01L 2224/48247* (2013.01); *H01L 2224/48257* (2013.01); *H01L 2224/49052* (2013.01); *H01L 2224/73265* (2013.01)

(56) References Cited

U.S. PATENT DOCUMENTS

| | | | |
|---|---|---|---|
| 2002/0003293 A1* | 1/2002 | Kobayashi | H01L 24/32 257/676 |
| 2002/0079590 A1* | 6/2002 | Nakaoka | H01L 23/3114 257/777 |
| 2011/0084384 A1* | 4/2011 | Sakata | H01L 25/50 257/737 |
| 2014/0353021 A1* | 12/2014 | Yugawa | H05K 1/115 174/258 |
| 2016/0190352 A1* | 6/2016 | Tsukagoshi | H01L 23/49838 257/432 |
| 2017/0069558 A1* | 3/2017 | Bang | H01L 23/49579 |
| 2018/0158770 A1* | 6/2018 | Lin | H01L 25/105 |

\* cited by examiner

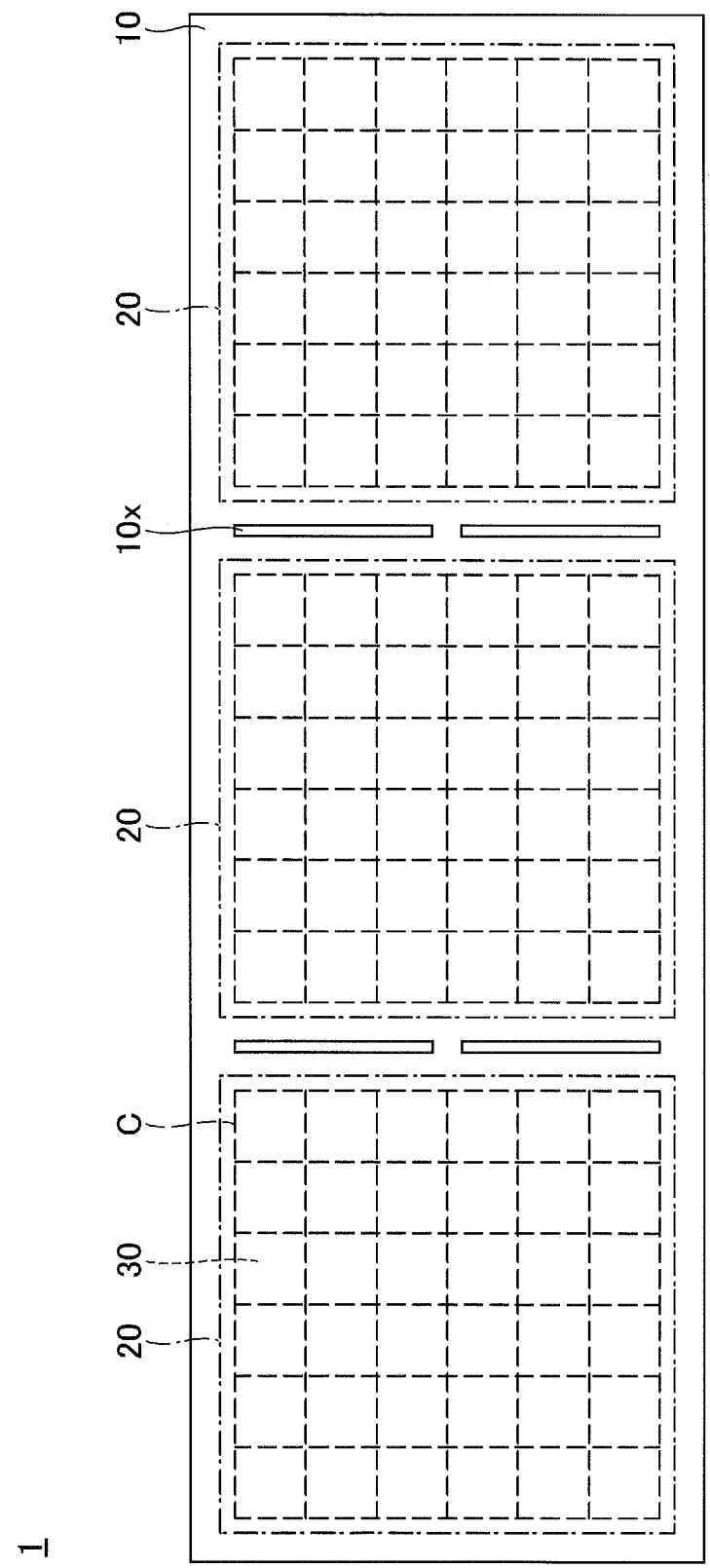

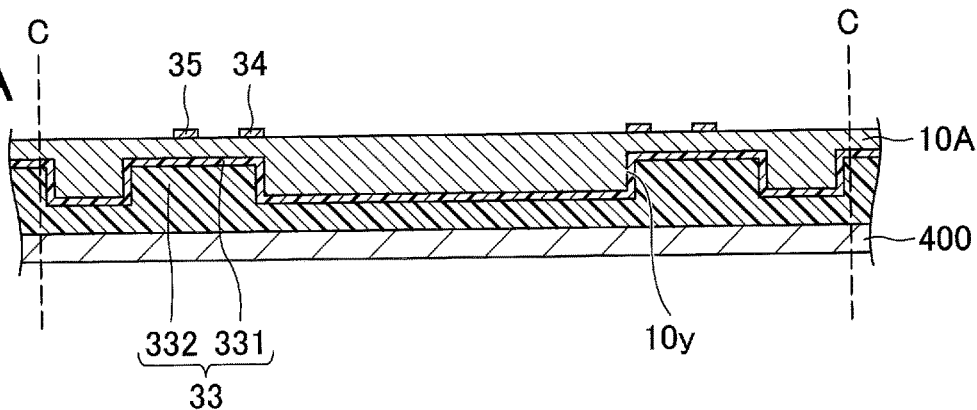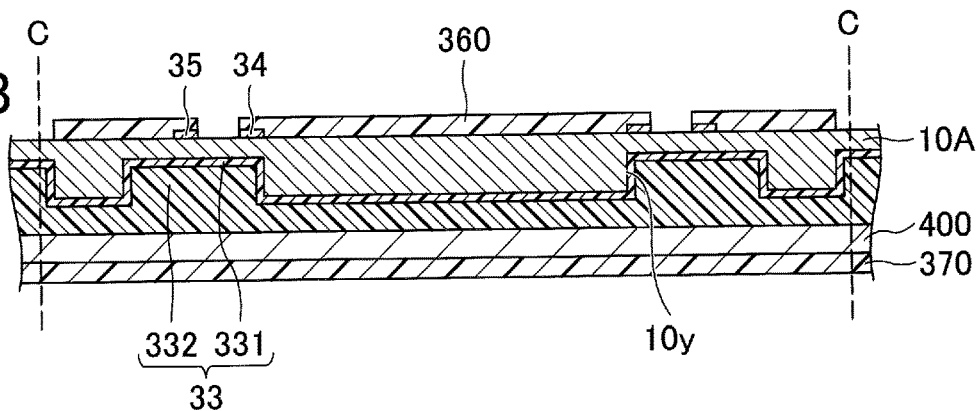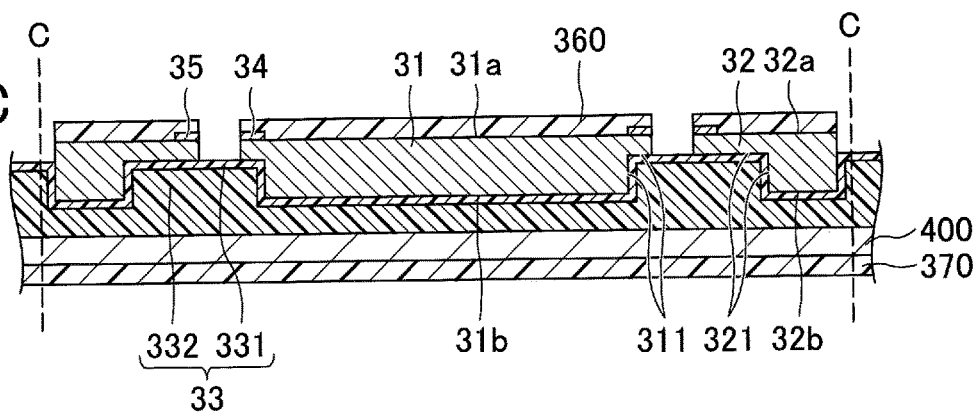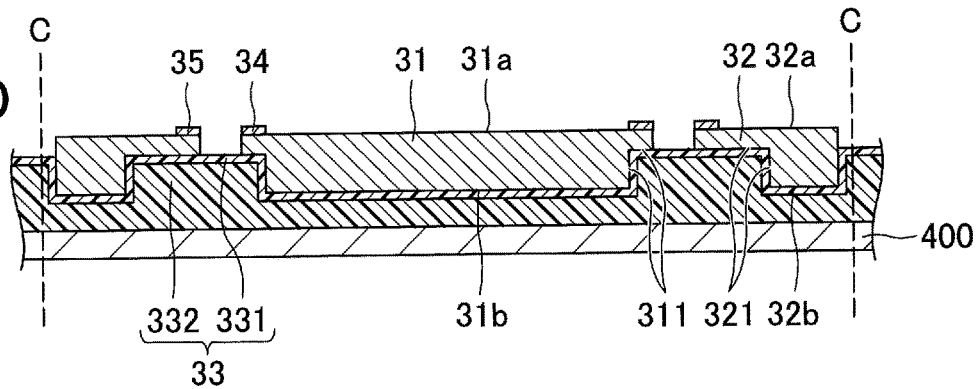

SUBSTRATE WITH MULTI-LAYER RESIN STRUCTURE AND SEMICONDUCTOR DEVICE INCLUDING THE SUBSTRATE

CROSS-REFERENCE TO RELATED APPLICATION

This application is based upon and claims the benefit of priority of the prior Japanese Patent Application No. 2017-180608, filed on Sep. 20, 2017, the entire contents of which are incorporated herein by reference.

FIELD

Certain aspects of the embodiments discussed herein are related to a substrate for semiconductor elements, a method of manufacturing the substrate for semiconductor elements, a semiconductor device, and a method of manufacturing the semiconductor device.

BACKGROUND

An example of a known substrate for semiconductor elements is mounted with the semiconductor elements to form a part of a semiconductor device. The substrate for semiconductor elements is manufactured by forming a groove structure that becomes a wiring pattern on one surface of a metal plate. After filling the groove structure with a liquid premold resin, the liquid premold resin is cured by heating.

However, in the substrate for semiconductor elements having the structure described above, adhesion between the premold resin and the metal plate is poor. In addition, the substrate for semiconductor elements may warp due to differences between coefficients of thermal expansion of the premold resin and the metal plate.

An example of the substrate for semiconductor elements is proposed in Japanese Patent No. 5526575 (or Japanese Laid-Open Patent Publication No. 2010-238694, for example.

SUMMARY

Accordingly, it is an object in one aspect of the embodiments to provide a substrate for semiconductor elements, a method of manufacturing the substrate for semiconductor elements, a semiconductor device, and a method of manufacturing the semiconductor device, that can improve the adhesion between a resin and a metal in the substrate for semiconductor elements, and to reduce warping of the substrate for semiconductor elements.

According to one aspect of the embodiments, a substrate for semiconductor elements includes a terminal part including a first surface, a second surface opposite to the first surface, and side surfaces joining the first surface and the second surface; and a resin part covering the side surfaces and exposing the first surface of the terminal part, wherein the resin part has a multi-layer structure including a first resin and a second resin, wherein the first resin is provided in contact with the side surfaces of the terminal part, wherein the first resin and the second resin include a filler, and wherein an amount of the filler included in the first resin is smaller than an amount of the filler included in the second resin.

According to another aspect of the embodiments, a semiconductor device includes the substrate for semiconductor elements described above; and a semiconductor element mounted on a surface of the substrate for semiconductor elements, wherein the semiconductor element and the terminal part are electrically connected.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 1 is a plan view illustrating an example of a substrate for semiconductor elements in a first embodiment;

FIG. 20A, FIG. 20B, FIG. 20C, and FIG. 20D are diagrams illustrating examples of manufacturing processes of the substrate for semiconductor elements in the fifth modification of the first embodiment;

DESCRIPTION OF EMBODIMENTS

Figure 2A:
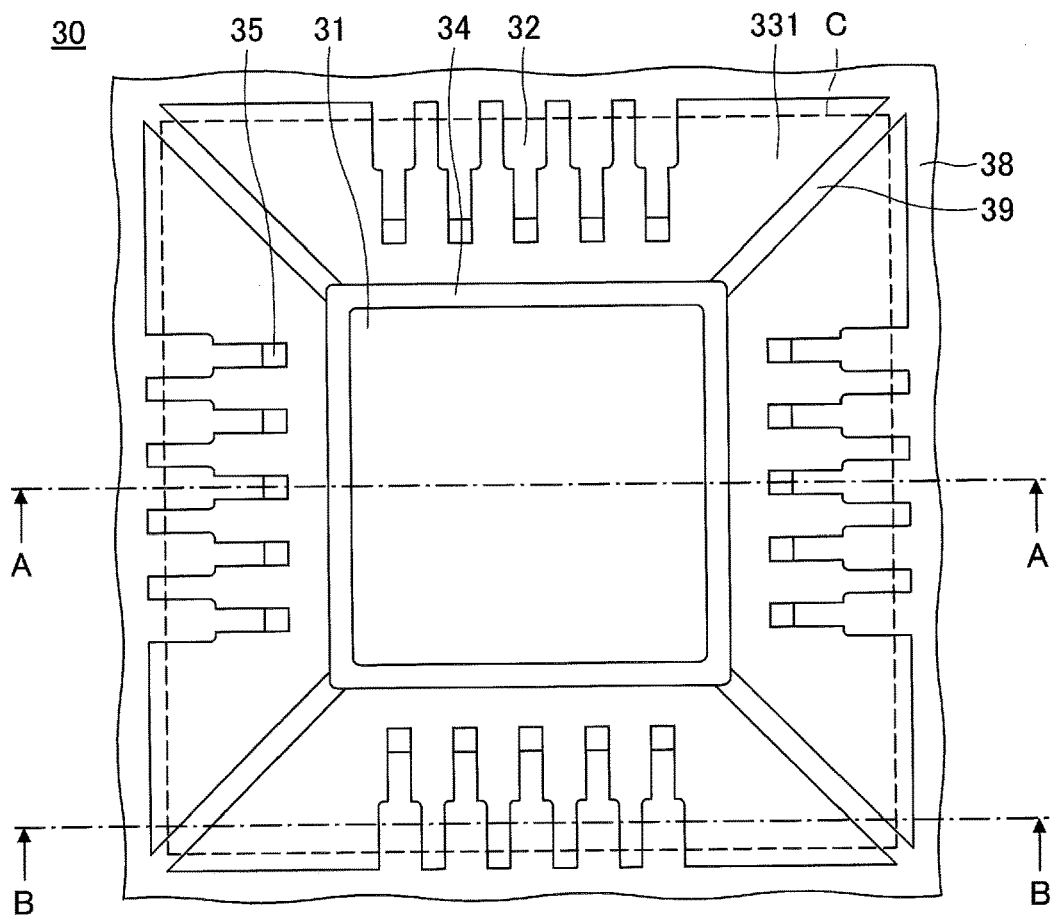
FIG. 2A, FIG. 2B, and FIG. 2C are diagrams illustrating an example of a unit substrate forming the substrate for semiconductor elements in the first embodiment.

Preferred embodiments of the present invention will be described with reference to the accompanying drawings. In the drawings, those parts that are the same are designated by the same reference numerals, and a repeated description of the same parts may be omitted.

First Embodiment

[Structure of Substrate for Semiconductor Elements]

FIG. 1 is a plan view illustrating an example of a substrate for semiconductor elements in a first embodiment. As illustrated in FIG. 1, a substrate 1 for semiconductor elements has a structure in which a plurality of unit substrate groups 20, indicated by one-dot chain lines, are separated from each other and arranged on a substrate frame 10 having an approximately rectangular shape in the plan view.

In the example illustrated in FIG. 1, three unit substrate groups 20 are arranged in one column. However, the number of unit substrate groups 20 that are arranged may be determined arbitrarily. In addition, the unit substrate groups 20 may be arranged in a plurality of columns. Further, although a slit 10x is provided between two mutually adjacent unit substrate groups 20 in the example illustrated in FIG. 1, the slit 10x may be omitted.

The substrate 1 for semiconductor elements may be made of a material selected from copper (Cu), Cu-based alloys, iron-nickel (Fe—Ni), Fe—Ni-based alloys, stainless steel, or the like, for example.

A plurality of unit substrates 30 are arranged in a matrix arrangement in each unit substrate group 20. The unit substrates 30 are finally mounted with semiconductor elements, and are cut at cutting positions C indicated by dotted lines, to form a part of individual semiconductor devices, respectively. In the example illustrated in FIG. 1, the unit substrate group 20 is formed by six rows by six columns of unit substrates 30 arranged in the matrix arrangement. However, the number of unit substrates 30 forming the unit substrate group 20 may be determined arbitrarily.

Figure 2B:
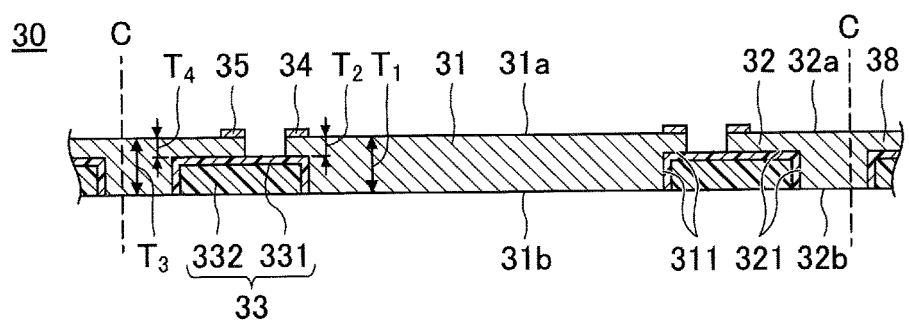
Figure 2C:
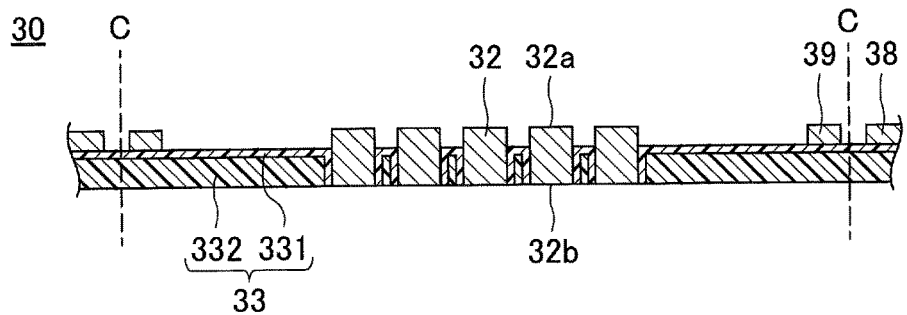
Figure 3:
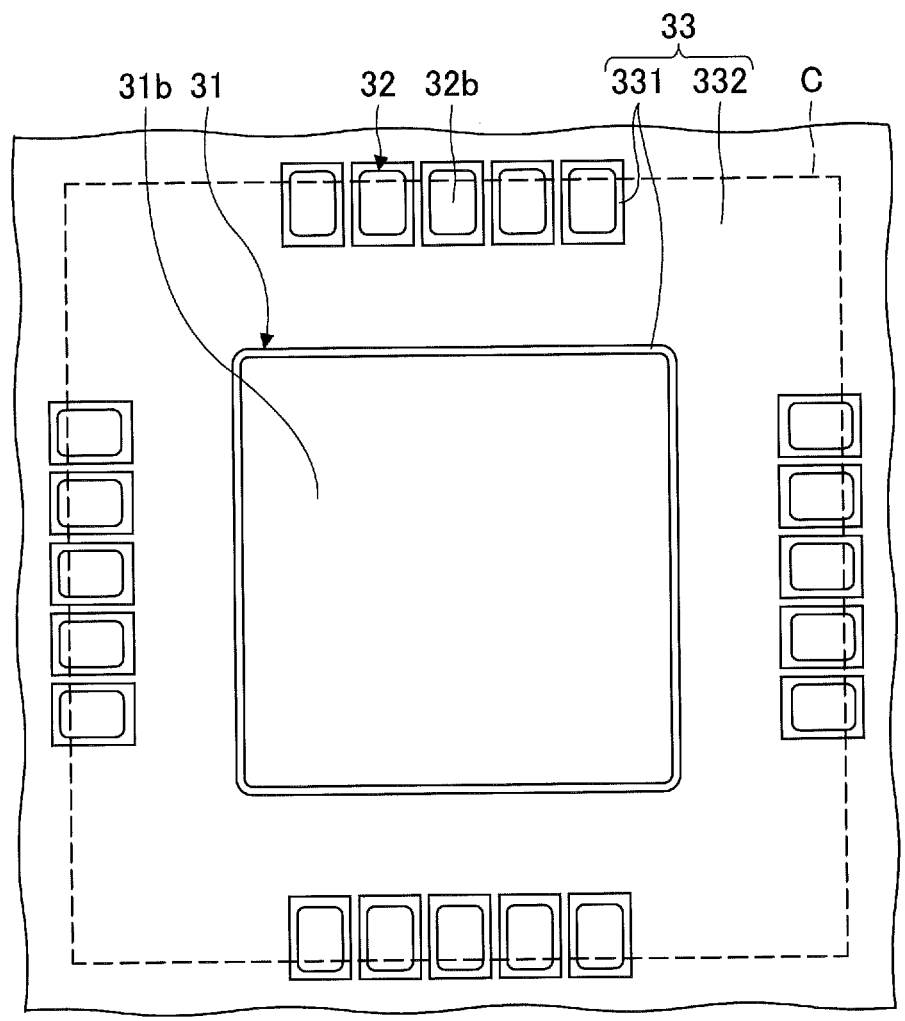
FIG. 3 is a bottom view illustrating an example of the unit substrate forming the substrate for semiconductor elements in the first embodiment.

FIG. 2A through FIG. 2C are diagrams illustrating an example of the unit substrate forming the substrate for semiconductor elements in the first embodiment. FIG. 2A illustrates a plan view, FIG. 2B illustrates a cross section along a line A-A in FIG. 2A, and FIG. 2C illustrates a cross section along a line B-B in FIG. 2A. FIG. 3 is a bottom view illustrating an example of the unit substrate forming the substrate for semiconductor elements in the first embodiment.

As illustrated in FIGS. 2A through 2C and FIG. 3, the unit substrate 30 includes a die pad 31, leads 32, a resin part 33, metal layers 34 and 35, a frame part 38, and support bars 39.

In this embodiment, for the sake of convenience, a surface of the unit substrate 30 on which the metal layers 34 and 35 are formed, is referred to as an upper surface or a first surface of the unit substrate 30, and an opposite surface of the unit substrate 30 on which the metal layers 34 and 35 are not formed, is referred to as a lower surface or a second surface of the unit substrate 30 opposite to the upper surface or the first surface of the unit substrate 30. However, the unit substrate 30 may be arranged upside down, or may be arranged at an arbitrary angle. In addition, a plan view of an object refers to a view from a normal direction of an upper surface 31a of the die pad 31, and a planar shape of the object refers to a shape in the view from the normal direction of the upper surface 31a of the die pad 31.

The die pad 31 is an example of a semiconductor element mounting part having an upper surface 31a on which a semiconductor element is mounted, and a lower surface 31b opposite to the upper surface 31a. For example, the die pad 31 is formed approximately at a central part of the unit substrate 30, and has a planar shape that is a rectangular shape. The frame part 38 is provided between adjacent unit substrates 30. In the plan view, four corners on an inner side of the frame part 38 and four corners on an outer side of the die pad 31 are connected by four elongated support bars 39 that are arranged obliquely or diagonally. The upper surface 31a of the die pad 31, upper surfaces 32a of the leads 32, an upper surface of the frame part 38, and upper surfaces of the support bars 39 may be arranged on the same plane, for example.

A cutout part 311 is provided in an annular shape, for example, in the lower surface 31b at the outer peripheral part of the die pad 31. A thickness $T_1$ of the die pad 31 at a part (that is, a part that is not thinned) where the cutout part 311 is not provided may be approximately 75 μm to approximately 200 μm, for example. A thickness $T_2$ of the die pad 31 at a part (that is, a part that is thinned) where the cutout part 311 is provided may be approximately one-half the thickness $T_1$, for example. Lower surfaces of the frame part 38 and the support bars 39 are half-etched, and thicknesses of the frame part 38 and the support bars 39 are approximately the same as the thickness $T_2$ of the die pad 31 at the part where the cutout part 311 is provided.

In the plan view, the plurality of leads 32 having the elongated shape are provided to extend from a predetermined region on an inner side of the frame part 38 toward the die pad 31. Each lead 32 is separated from the frame part 38 when the unit substrate 30 is cut at cutting positions C (or cut along cuttable positions C) during a manufacturing process of the semiconductor device, as will be described later. The leads 32 becomes electrically insulated from each other after being separated from the frame part 38.

The leads 32 form terminal parts that are arranged at positions separated from the outer peripheral part of the die pad 31. The leads 32 are separated from each other, and are arranged on the outer side of the die pad 31. A cutout part 321 is provided in the lower surface 32b at an end part of the lead 32 facing the outer peripheral part of the die pad 31. A thickness $T_3$ of the lead 32 at a part (that is, a part that is not thinned) where the cutout part 321 is not provided may be approximately 75 μm to approximately 200 μm, for example. A thickness $T_4$ of the lead 32 at a part (that is, a part that is thinned) where the cutout part 321 is provided may be approximately one-half the thickness $T_3$, for example. The thickness $T_1$ and the thickness $T_3$ are approximately the same, and the thickness $T_2$ and the thickness $T_4$ are approximately the same.

The resin part 33 hold the die pad 31 and the leads 32 in a state in which the upper surface 31a of the die pad 31 and the upper surfaces 32a of the leads 32 are exposed. The resin part 33 is provided so as to fill the cutout part 311 and the cutout part 321.

More particularly, in the plan view, the resin part 33 is provided so as to fill regions where the die pad 31, the leads 32, the frame part 38, and the support bars 39 are not provided. In addition, the resin part 33 is provided to fill the cutout parts 311 and 321, and to cover the half-etched lower surfaces of the frame part 38 and the support bars 39. In other words, the frame part 38 and the support bars 39 are provided on the resin part 33. Accordingly, in the bottom view of the unit substrate 30 illustrated in FIG. 3, inner wall surfaces of the cutout parts 311 and 321 and the lower surfaces of the frame part 38 and the support bars 39 are not exposed from the resin part 33. The resin part 33 exposes the lower surface 31b of the die pad 31 and the lower surfaces 32b of the leads 32.

The resin part 33 has a multi-layer structure, or a laminated structure, including a first resin 331 and a second resin 332. The first resin 331 is arranged to make contact with the inner wall surfaces of the cutout part 311 and the inner wall surfaces of the cutout part 321. The second resin 332 is arranged to sandwich the first resin 331 between the second resin 332 and each of the inner wall surfaces of the cutout part 311 and the inner wall surfaces of the cutout part 321. In other words, the first resin 331 exists between the second resin 332 and each of the inner wall surfaces of the cutout part 311 and the inner wall surfaces of the cutout part 321. The second resin 332 does not make contact with the inner wall surfaces of the cutout part 311, and also does not make contact with the inner wall surfaces of the cutout part 321.

The first resin 331 extends from inside the cutout part 311 toward a part of a side surface (lower part of the side surface) of the die pad 31, to directly cover the part of the side surface of the die pad 31. In addition, the first resin 331 extends from inside the cutout part 321 toward a part of side surfaces (lower part of the side surfaces) of the leads 32, to directly cover the part of the side surfaces of the leads 32. The second resin 332 is arranged to stretch over the first resin 331 that extends from inside the cutout part 311 toward the part of the side surface (lower part of the side surface) of the die pad 31, to directly cover the part of the side surface of the die pad 31. In addition, the second resin 332 is arranged to stretch over the first resin 331 that extends from inside the cutout part 321 toward the part of side surfaces (lower part of the side surfaces) of the leads 32, to directly cover the part of the side surfaces of the leads 32.

The part of the side surface of the die pad 31, not provided with the cutout part 311 and closer to the upper surface 31a, is exposed from the resin part 33. In addition, the part of the side surface of the lead 32, not provided with the cutout part 321 and closer to the upper surface 32a, is exposed from the resin part 33.

The lead 32 includes a main lead body that extends along an upper surface of the resin part 33 in an in-plane direction. An upper surface and side surfaces of the main lead body of the lead 32 are exposed from the resin part 33, and a lower surface of the main lead body makes contact with the resin part 33 (first resin 331). The upper surface 32a of the lead 32 forms the upper surface of the main lead body.

The lead 32 includes an external connection part that projects downward from the main lead body, and this external connection part is exposed from a lower surface of the resin part 33. Side surfaces of the external connection part make contact with the resin part 33 (first resin 331), and a lower surface of the external connection part is exposed from the lower surface of the resin part 33. The lower surface 32b of the lead 32 that is exposed from the resin part 33 forms the lower surface of the external connection part.

Accordingly, the resin part 33 fills the inside of the cutout part 311 and the inside of the cutout part 321, and covers the lower parts of the side surfaces of the die pad 31 and the leads 32. In other words, the upper surfaces of the die pad 31 and the leads 32 project from the upper surface of the resin part 33. In addition, the first resin 331 includes parts in contact with the die pad 31 and the leads 32. On the other hand, the second resin 332 includes no parts in contact with the die pad 31 and the leads 32.

The first resin 331 is arranged to make contact with the lower surface of the frame part 38 and the lower surfaces of the support bars 39. The second resin 332 is arranged to sandwich the first resin between the second resin 332 and each of the lower surface of the frame part 38 and the lower surfaces of the support bars 39. In other words, the first resin 331 exists between the second resin 332 and each of the lower surface of the frame part 38 and the lower surfaces of the support bars 39. The second resin 332 does not make contact with the lower surface of the frame part 38, and also does not make contact with the lower surfaces of the support bars 39.

The lower surface of the resin part 33 (lower surface of the first resin 331 and lower surface of the second resin 332), the lower surface 31b of the die pad 31, and the lower surfaces 32b of the leads 32 may be arranged on the same plane, for example.

The first resin 331 and the second resin 332 may be made of a material such as an epoxy resin, a polyimide resin, or the like. The first resin 331 and the second resin 332 include a filler, such as silica, alumina, or the like, for example. An amount of the filler included in the first resin 331 is smaller than an amount of the filler included in the second resin 332. A type of the filler included in the first resin 331 may be the same as, or may be different from, a type of the filler included in the second resin 332.

By reducing the amount of the filler included in the first resin 331 in contact with the die pad 31, the leads 32, the frame part 38, and the support bars 39, it is possible to increase a contact area of a resin part (part excluding the filler) forming the first resin 331 and the die pad 31, the leads 32, the frame part 38, and the support bars 39. For this reason, it is possible to improve an adhesion of the first resin 331 with respect to the die pad 31, the leads 32, the frame part 38, and the support bars 39.

On the other hand, by increasing the amount of the filler included in the second resin 332, it is possible to easily adjust a coefficient of thermal expansion of the resin part 33. For example, when the amount of the filler included in the second resin 332 is adjusted so that the coefficient of thermal expansion of the resin part 33 becomes approximately the same as coefficients of expansion of the die pad 31, the leads 32, the frame part 38, and the support bars 39, it is possible to reduce warping of the substrate 1 for semiconductor elements.

The annular metal layer 34 is formed on the upper surface 31a of the die pad 31, in a region located at the outer peripheral part of the die pad 31. In addition, the lead 32 has a reduced width from approximately the central part toward the outer side of the die pad 31 along a longitudinal direction of the lead 32. The metal layer 35 is formed on the upper surface 32a of the lead 32 at an end part (end part facing the outer peripheral part of the die pad 31) of a region of the upper surface 32a of the lead 32 having the reduced width. It is not essential that the lead 32 has the reduced width from approximately the central part toward the outer side of the die pad 31 along the longitudinal direction of the lead 32, and the lead 32 may have a constant width along the longitudinal direction thereof.

The metal layers 34 and 35 may be used as bonding pads for electrically connecting to electrodes of the semiconductor element mounted on the die pad 31 via metal wires. For example, the metal layers 34 and 35 may be formed by a Ag layer, a Au layer, a Sn layer, a Ni/Au layer structure (metal layer structure including a Ni layer and a Au layer that are stacked in this order), a Ni/Pd/Au layer structure (metal layer structure including a Ni layer, a Pd layer, and a Au layer that are stacked in this order), or the like.

[Method of Manufacturing Substrate for Semiconductor Elements]

Next, a method of manufacturing the substrate for semiconductor elements in the first embodiment, with reference to illustrations of the unit substrate 30.

FIG. 4A through FIG. 4E, FIG. 5A through FIG. 5D, and FIG. 6A through FIG. 6C are diagrams illustrating examples of manufacturing processes of the substrate for semiconductor elements in the first embodiment. FIG. 4A through FIG. 4E, FIG. 5A through FIG. 5D, and FIG. 6A through FIG. 6C illustrate cross sections corresponding to the cross section illustrated in FIG. 2B.

Figure 4A:
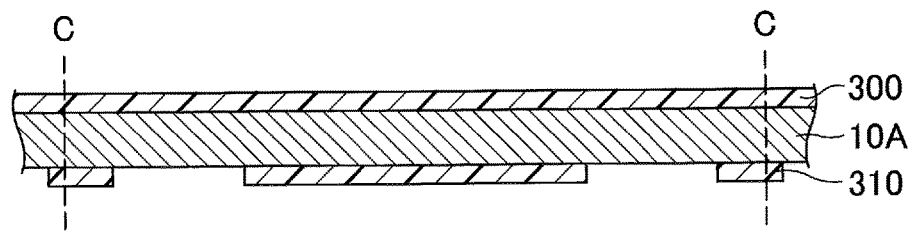
FIG. 4A, FIG. 4B, FIG. 4C, FIG. 4D, and FIG. 4E are diagrams illustrating examples of manufacturing processes of the substrate for semiconductor elements in the first embodiment.

First, in the process illustrated in FIG. 4A, a plate member (or metal plate) 10A made of a metal material, having the same shape as the substrate frame 10 illustrated in FIG. 1, is prepared. For example, the metal material forming the plate member 10A may be copper (Cu), Cu-based alloys, iron-nickel (Fe—Ni), Fe—Ni-based alloys, stainless steel, or the like. A thickness of the plate member 10A may be approximately 75 μm to approximately 200 μm, for example.

Next, a photoresist 300 is formed on an entire upper surface of the plate member 10A, and a photoresist 310 is formed on an entire lower surface of the plate member 10A. For example, the photoresist 300 and the photoresist 310 may be made of a dry film resist or the like. The photoresist 310 is exposed, developed, and patterned so as to expose the regions that are to be half-etched. The photoresist 310 is patterned so as to expose the regions where the cutout parts 311 and 321 are to be provided, and the regions where the frame part 38 and the support bars 39 are to be provided. In this state, the photoresist 300 still covers the entire upper surface of the plate member 10A.

Figure 4B:
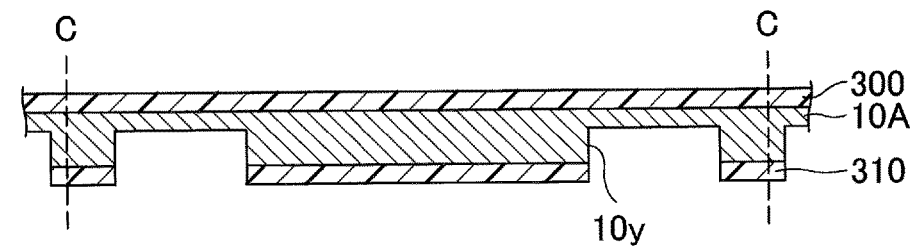

Next, in the process illustrated in FIG. 4B, the plate member 10A is half-etched, using the photoresist 300 and the photoresist 310 as etching masks. The regions not covered by the resist 310 are half-etched from the lower surface of the plate member 10A, to form a cavity part 10y that caves in from the lower surface of the plate member 10A toward the upper surface of the plate member 10A. In a case in which the plate member 10A is made of copper, the cavity part 10y may be formed by a wet etching using a cupric chloride solution, for example. The cavity part 10y is formed in the regions where the cutout parts 311 and 321 are to be provided, and in the regions where the frame part 38 and the support bars 39 are to be provided. In other words, in the process illustrated in FIG. 4B, the lower surface of the plate member 10A is half-etched in the regions where the frame part 38 and the support bars 39 are to be provided.

Figure 4C:
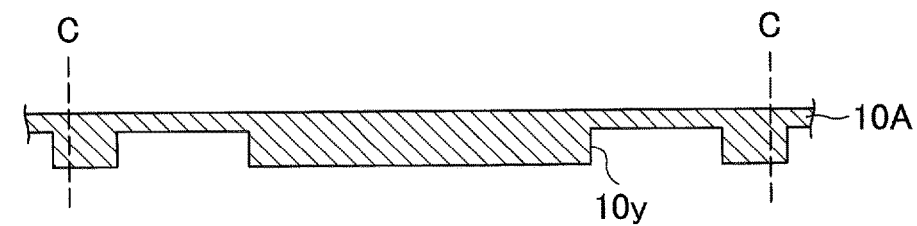

Next, in the process illustrated in FIG. 4C, the photoresist 300 and the photoresist 310 illustrated in FIG. 4B are removed. After removing the photoresist 300 and the photoresist 310, a surface roughening process may be performed, if necessary, on the upper surface and the lower surface of the plate member 10A, including inner wall surfaces of the cavity part 10y. The surface roughening process is not limited to a particular roughening process. For example, the surface roughening process may be an oxidation process, a blasting process, or the like. By performing the surface roughening process, it is possible to further improve the adhesion between the plate member 10A and the first resin 331.

Figure 4D:
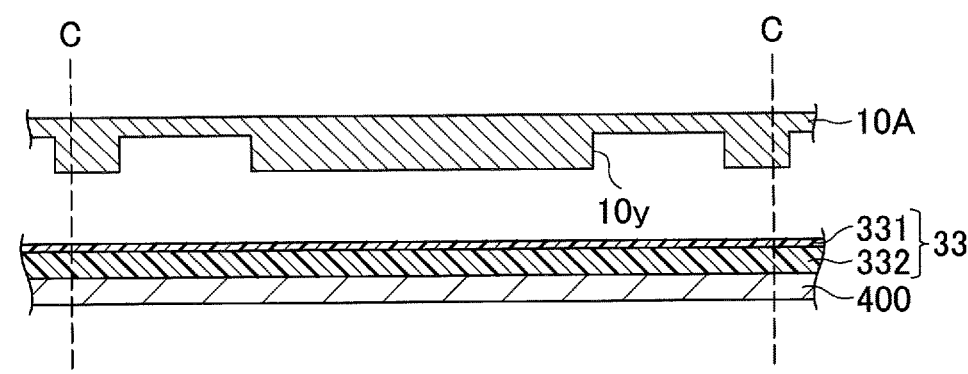

Next, in the process illustrated in FIG. 4D, the resin part 33 in the form of a film and provided on a metal film 400, is prepared. The resin part 33 has the multi-layer structure in which the second resin 332 and the first resin 331 are successively stacked on the metal film 400. At this stage of the manufacturing process, the second resin 332 and the first resin 331 are in a B-stage state (semi-cured state). In a case in which surface roughnesses of upper and lower surfaces of the metal film 400 are different, the resin part 33 is preferably provided on the surface having the smaller surface roughness, in order to facilitate separation of the metal film 400 from the resin part 33 at a later stage of the manufacturing process.

The metal film 400 may be a copper film having a thickness of approximately 12 μm to approximately 25 μm, for example. The first resin 331 and the second resin 332 may be an epoxy resin, a polyimide resin, or the like, for example. The first resin 331 may have a thickness of approximately 10 μm to approximately 30 μm, for example. The second resin 332 may have a thickness of approximately 30 μm to approximately 50 μm, for example. The first resin 331 and the second resin 332 include a filler such as silica, alumina, or the like, for example. The amount of the filler included in the first resin 331 is smaller than the amount of the filler included in the second resin 332.

In the process illustrated in FIG. 4D, instead of the resin part 33 that is formed by successively stacking the second resin 332 and the first resin 331 on the metal film 400, it is possible to use a resin part 33 that is formed by successively stacking the second resin 332 and the first resin 331 on a support film. In this case, the support film may be a resin film made of polyethylene terephthalate, polyethylene, or the like, for example. In addition, the support film may have a thickness of approximately 30 μm to approximately 40 μm, for example. The support film may be mechanically removed in the process illustrated in FIG. 5D that will be described later.

Figure 4E:
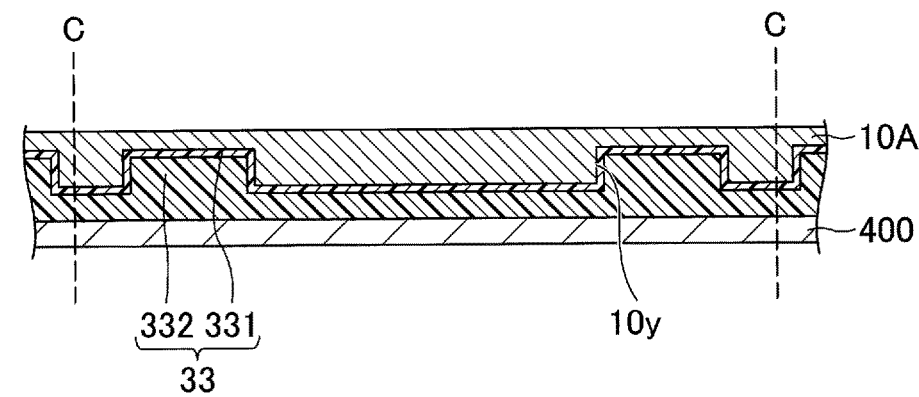

Next, as illustrated in FIG. 4E, the resin part 33 is adhered on the lower surface of the plate member 10A, and the cavity part 10y is filled by the resin part 33. More particularly, the metal film 400 provided with the resin part 33 is arranged so that the first resin 331 opposes the lower surface of the plate member 10A, and the plate member 10A is pressed toward the metal film 400 in FIG. 4D. The first resin 331 and the second resin 332 in the B-stage state are deformed in conformance with the shape of the cavity part 10y, to fill the cavity part 10y. In this state, only the first resin 331 forming the upper layer of the resin part 33 makes contact with the lower surface of the plate member 10A, including the inner wall surface of the cavity part 10y. Thereafter, the first resin 331 and the second resin 332 are heated to a curing temperature or higher, to cure the first resin 331 and the second resin 332 and adhere the resin part 33 to the lower surface of the plate member 10A. The first resin 331 and the second resin 332 may be heated while pressing the plate member 10A toward the metal film 400 in FIG. 4D. Because the metal film 400 is provided on the lower surface of the resin part 33 opposite to the upper surface of the resin part 33 to which the plate member 10A is adhered, it is possible to improve a rigidity or strength of the product during the manufacturing process, to enable a stable process to be performed at subsequent stages of the manufacturing process.

Figure 5A:
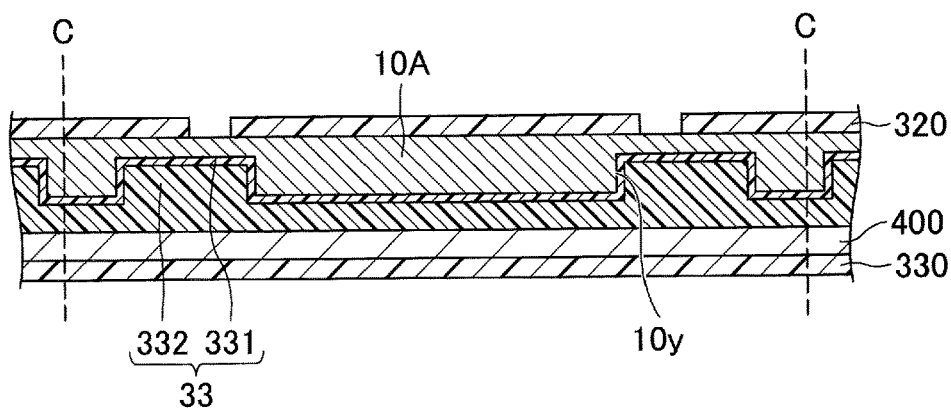
FIG. 5A, FIG. 5B, FIG. 5C, and FIG. 5D are diagrams illustrating examples of the manufacturing processes of the substrate for semiconductor elements in the first embodiment.

Next, in the process illustrated in FIG. 5A, a photoresist 320 is formed on the entire upper surface of the plate member 10A, and a photoresist 330 is formed on the entire lower surface of the metal film 400. For example, the photoresist 320 and the photoresist 330 may be made of a dry film resist or the like. The photoresist 320 is exposed, developed, and patterned so as to expose the regions that are to be etched. In the plan view, the photoresist 320 is patterned so as to cover the regions where the die pad 31, the leads 32, the frame part 38, and the support bars 39 illustrated in FIG. 2A are provided. In this state, the photoresist 330 still covers the entire lower surface of the metal film 400.

Figure 5B:
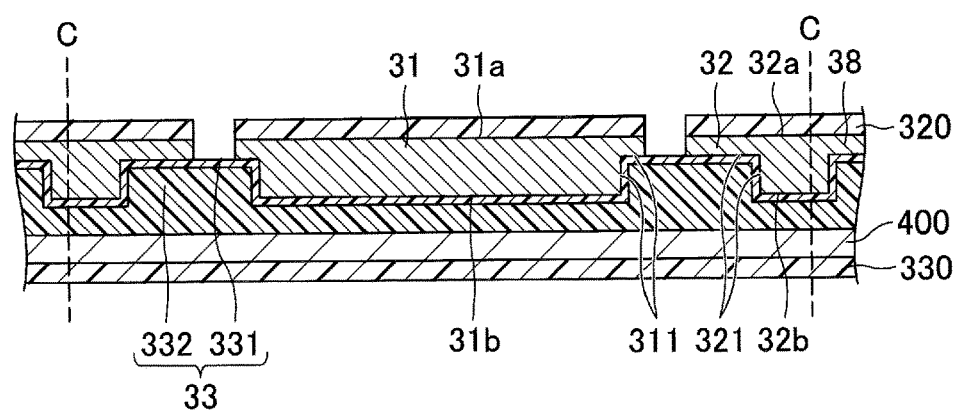

Next, in the process illustrated in FIG. 5B, the plate member 10A is etched using the resist 320 and the resist 330 as etching masks. Hence, a part of the region forming a bottom part of the cavity part 10y in the plate member 10A is removed, to form the planar-shaped die pad 31, the leads 32, the frame part 38, and the support bars 39 illustrated in FIG. 2A. In this state, the cutout part 311 is provided in the lower surface 31b of the die pad 31, and separates the cavity part 10y. In addition, the cutout part 321 is provided in the lower surface 32b of the lead 32, in the region of the lead 32 opposing the die pad 31, and separates the cavity part 10y.

In the case in which the plate member 10A is made of copper, the die pad 31 including the cutout part 311, the leads 32 including the cutout part 321, the frame part 38, and the support bars 39 may be formed by the wet etching using the cupric chloride solution, for example. Because the bottom part of the cavity part 10y is made thin by the half-etching performed in the process illustrated in FIG. 4B, the wet etching can be performed with ease, thereby making it possible to form the leads 32 that are arranged at a narrow pitch. The pitch of the leads 32 may be approximately 30 μm to approximately 70 μm, for example.

Figure 5C:
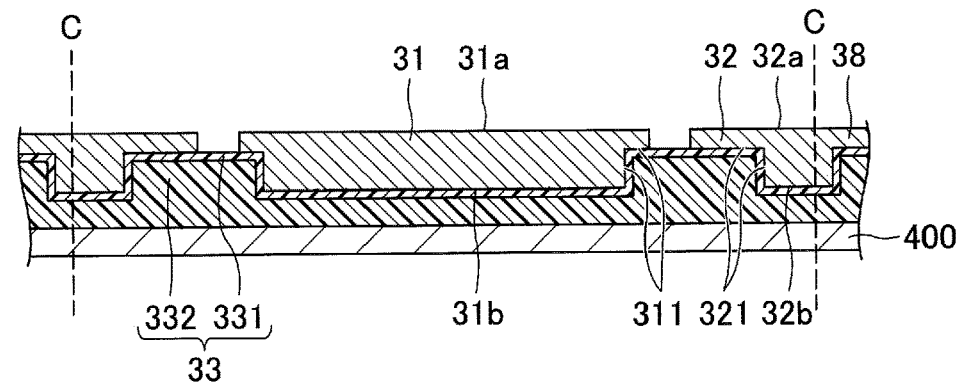

Next, in the process illustrated in FIG. 5C, the photoresist 320 and the photoresist 330 illustrated in FIG. 5B are removed.

Figure 5D:
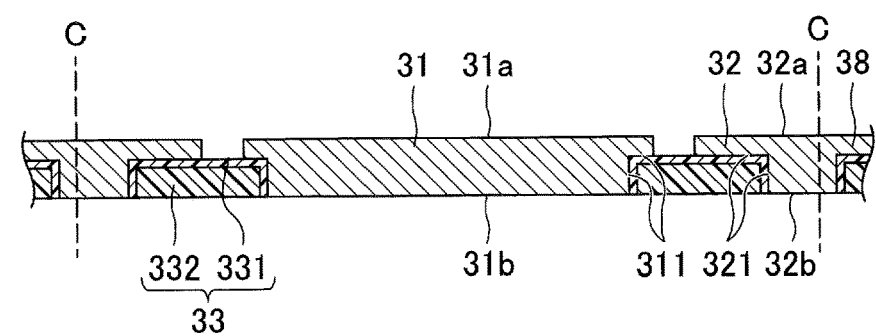

Next, in the process illustrated in FIG. 5D, the metal film 400 is first removed. The second resin 332 in contact with the metal film 400 includes the large amount of the filler (large filler-content), and thus, the adhesion between the second resin 332 and the metal film 400 is poor. For this reason, the metal film 400 can be mechanically removed from the second resin 332 with ease. Of course, the metal film 400 may be removed by buffing, wet blasting, or the like. Similarly, the support film used in place of the metal film 400 may be mechanically removed by similar methods.

After removing the metal film 400, the resin part 33 formed below the lower surface 31b of the die pad 31 and the lower surfaces 32b of the leads 32 is removed, to expose the lower surface 31b of the die pad 31 and the lower surfaces 32b of the leads 32. For example, the lower surface of the resin part 33, from which unwanted parts are removed, is located on the same plane as the lower surface 31b of the die pad 31 and the lower surfaces 32b of the leads 32. The unwanted parts of the resin part 33 may be removed by buffing, wet blasting, or the like, for example.

In a case in which a buffing compound, an abrasive, or the like remains on the lower surface 31b of the die pad 31 and on the lower surfaces 32b of the leads 32, a soft etching is preferably performed to remove the residual buffing compound, abrasive, or the like on the lower surface 31b of the die pad 31 and on the lower surfaces 32b of the leads. The soft etching refers to an etching that can uniformly etch a surface of an object by a thickness of approximately several μm. In a case in which the die pad 31 and the leads 32 are made of copper, the soft etching can be performed using the cupric chloride solution, for example. When the soft etching is performed to remove the residual buffing compound, abrasive, or the like, the lower surface 31b of the die pad 31 and the lower surfaces 32b of the leads 32 cave in slightly from the lower surface of the resin part 33.

Figure 6A:
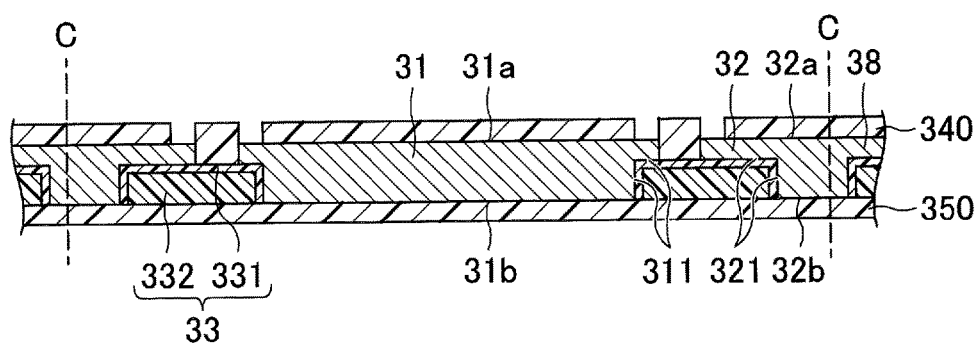
FIG. 6A, FIG. 6B, and FIG. 6C are diagrams illustrating examples of the manufacturing processes of the substrate for semiconductor elements in the first embodiment.

Next, in the process illustrated in FIG. 6A, a photoresist 340 is formed on the upper surface 31a of the die pad 31, the upper surfaces 32a of the leads 32, the upper surface of the frame part 38, and the upper surfaces of the support bars 39. Similarly, a photoresist 350 is formed on the lower surface 31b of the die pad 31, the lower surfaces 32b of the leads 32, and the lower surface of the resin part 33. For example, the photoresist 340 and the photoresist 350 may be made of a dry film resist or the like. The photoresist 340 is exposed, developed, and patterned so as to expose the regions where the metal layers 34 and 35 are to be formed. In this state, the photoresist 350 still covers all of the lower surface 31b of the die pad 31, the lower surfaces 32b of the leads 32, and the lower surface of the resin part 33.

Figure 6B:
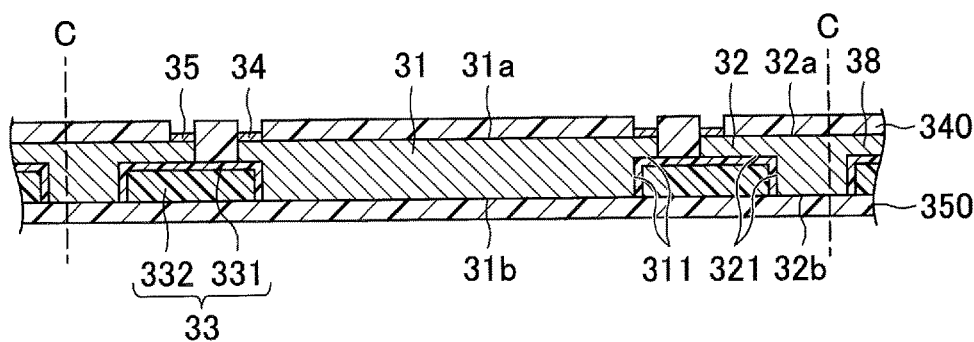

Next, in the process illustrated in FIG. 6B, the metal layer 34 is formed on the upper surface 31a of the die pad 31 in the region not covered by the photoresist 340. In addition, the metal layer 35 is formed on the upper surfaces 32a of the leads 32 in the regions not covered by the photoresist 340. The materials described above may be used for the metal layers 34 and 35. The metal layers 34 and 35 may be formed by electroplating, for example. The die pad 31 and the leads 32 of each unit substrate 30 are electrically connected to each other via the frame part 38 and the support bars 39. For this reason, the frame part 38 and the support bars 39 may be used as feed paths when performing the electroplating.

Figure 6C:
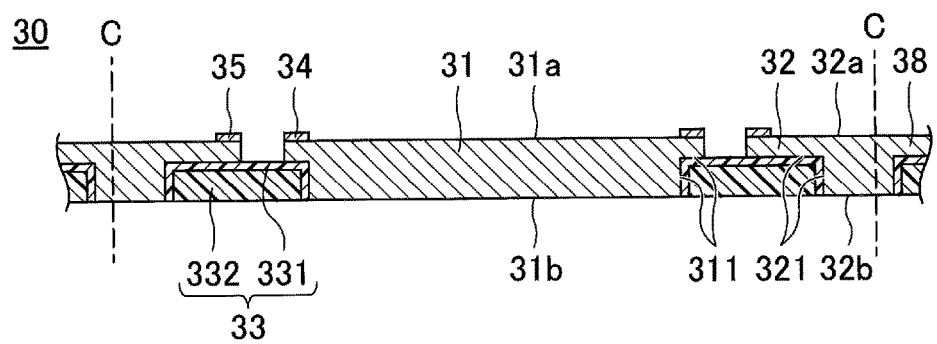

Next, in the process illustrated in FIG. 6C, the photoresist 340 and the photoresist 350 illustrated in FIG. 6B are removed. Accordingly, the substrate 1 for semiconductor elements illustrated in FIG. 1, in which the unit substrates 30 are arranged in the matrix arrangement, is completed.

The manufacturing process of the semiconductor device, including mounting of the semiconductor element on the unit substrate 30, will now be described, by referring to FIG. 7A through FIG. 7D. FIG. 7A, FIG. 7B, FIG. 7C, and FIG. 7D are diagrams illustrating examples of manufacturing processes of the semiconductor device in the first embodiment.

Figure 7A:
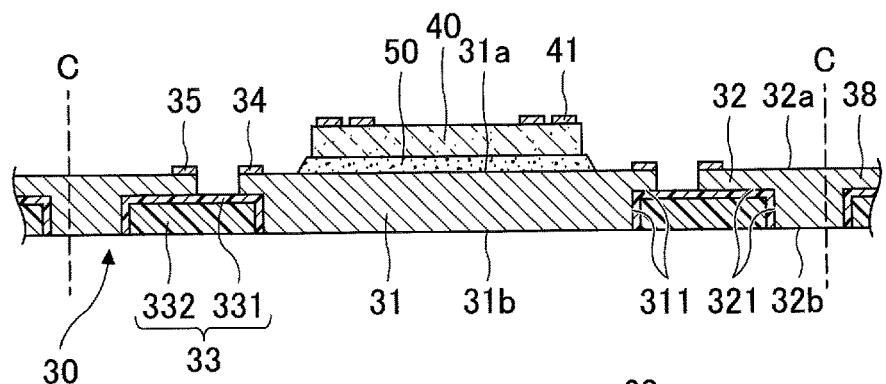
FIG. 7A, FIG. 7B, FIG. 7C, and FIG. 7D are diagrams illustrating examples of manufacturing processes of a semiconductor device in the first embodiment.

First, in the process illustrated in FIG. 7A, a semiconductor element 40 in a face-up state is mounted on the upper surface 31a of the die pad 31 of each unit substrate 30. The semiconductor element 40 may be mounted on the upper surface 31a of the die pad 31 through a conductive bonding material 50, such as silver paste or the like, by die bonding.

Figure 7B:
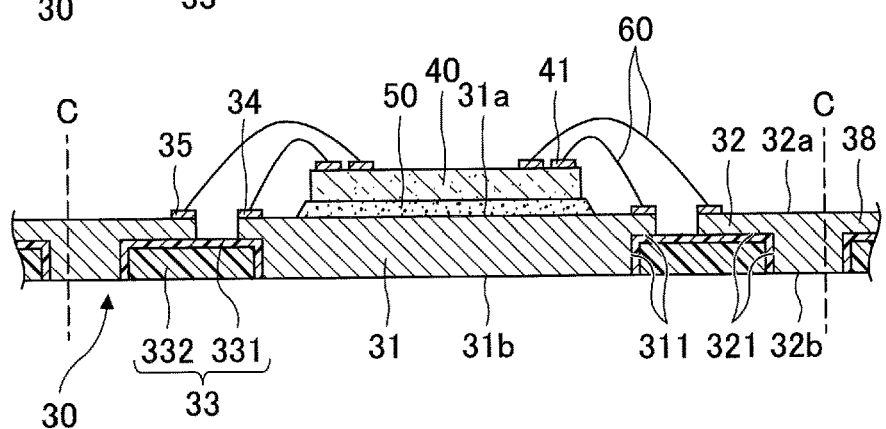

Next, in the process illustrated in FIG. 7B, electrode terminals 41 formed on a circuit forming surface of the semiconductor element 40 are electrically connected to the metal layers 34 and 35, via metal wires 60 formed by gold wires, copper wires, or the like. The metal wires 60 can connect the electrode terminals 41 of the semiconductor element 40 to the metal layers 34 and 35 by wire bonding, for example.

Figure 7C:
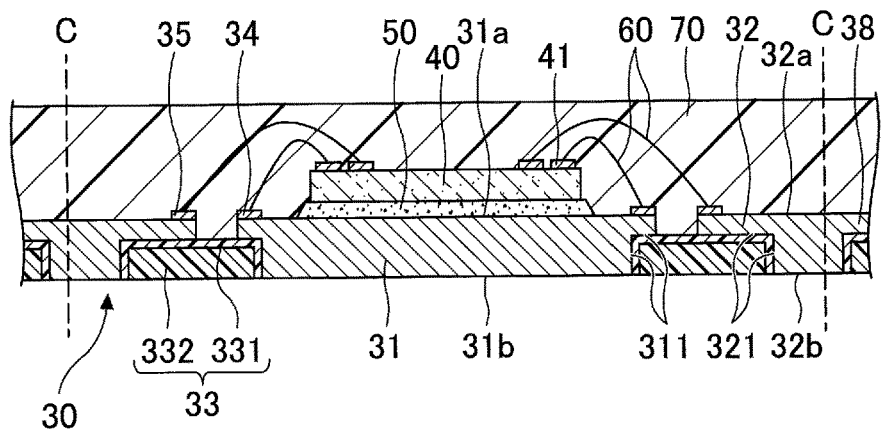

Next, in the process illustrated in FIG. 7C, an encapsulating resin 70 is formed to encapsulate each unit substrate 30, the semiconductor element 40, and the metal wires 60. The encapsulating resin 70 may be a so-called mold resin formed by an insulating resin, such as an epoxy resin or the like, and including a filler, for example. The encapsulating resin 70 may be molded by transfer molding, compression molding, or the like, for example. The encapsulating resin 70 is provided on the upper surface of the unit substrate 30.

Figure 7D:
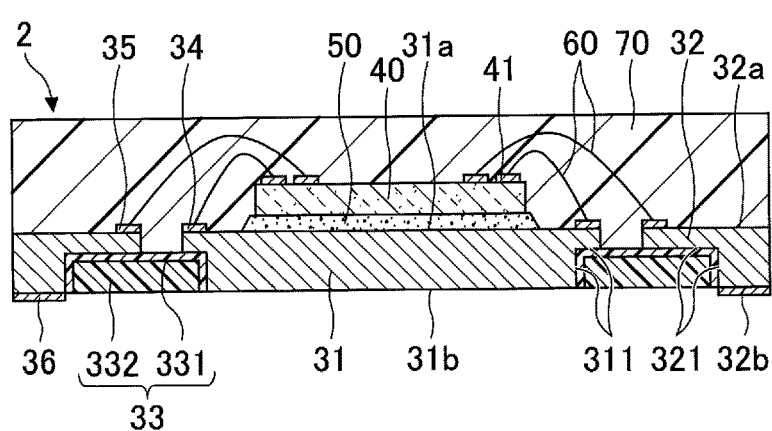

Next, in the process illustrated in FIG. 7D, a metal layer 36 for external connection is formed on the lower surfaces 32b of the leads 32, before cutting the unit substrates 30 into individual pieces. The metal layer 36 may be made of the same metal material as the metal layers 34 and 35. For example, the metal layer 36 may be formed by a Sn layer.

When forming the metal layer 36, a photoresist is formed on the lower surface 31b of the die pad 31, the lower surfaces 32b of the leads 32, and the lower surface of the resin part 33. The photoresist is thereafter exposed, developed, and patterned, so as to expose regions where the metal layer 36 is to be formed. Then, the metal layer 36 is famed on the lower surfaces 32b of the leads 32 in the regions not covered by the photoresist, by electroplating using the frame part 38 and the support bars 39 as the feed paths, for example. The photoresist is thereafter removed. The metal layer 36 may also be provided on the lower surface 31b of the die pad 31. In this case, the electroplating may be performed by omitting the photoresist forming process, and a metal layer that is the same as the metal layer 36 may be formed on the lower surface 31b of the die pad 31, simultaneously as the forming of the metal layer 36 on the lower surfaces 32b of the leads 32.

After forming the metal layer 36, the unit substrates 30 are cut at the cutting positions C into the individual pieces, to complete a plurality of semiconductor devices 2. The unit substrates 30 may be cut by a slicer or the like, for example. The electrode terminals 41 that are connected to the metal layer 34 via the metal wires 60 may connect the die pad 31 to ground GND, for example, to fix the die pad 31 to a ground potential GND.

In the semiconductor device 2, the upper surface 31a of the die pad 31 and the side surfaces of the die pad 31 closer to the upper surface 31a are covered by the encapsulating resin 70. In addition, the upper surfaces 32a of the leads 32 and the side surfaces of the leads 32 closer to the upper surfaces 32a are covered by the encapsulating resin 70. Further, side surfaces of the leads 32 that are formed by cutting the unit substrates 30 are exposed at side surfaces of the encapsulating resin 70 and at side surfaces of the resin part 33 that are respectively formed by cutting the unit substrates 30.

The semiconductor device 2 may be delivered as one product. Alternatively, the substrate 1 for semiconductor elements illustrated in FIG. 1, in the state before being cut into the individual pieces, and including the unit substrates 30 illustrated in FIG. 2A through FIG. 2C and FIG. 3, may be delivered as one product. In the latter case, the substrate 1 for semiconductor elements, delivered to a destination as one product, may be subjected to each of the processes described above in conjunction with FIG. 7A through FIG. 7D at the destination to manufacture the plurality of semiconductor devices 2.

First Modification of First Embodiment

In a first modification of the first embodiment, the substrate for semiconductor elements is provided with a metal film on the lower surface of the substrate for semiconductor elements. When describing the first modification of the first embodiment, a description of those parts that are the same as those corresponding parts of the first embodiment may be omitted.

Figure 8A:
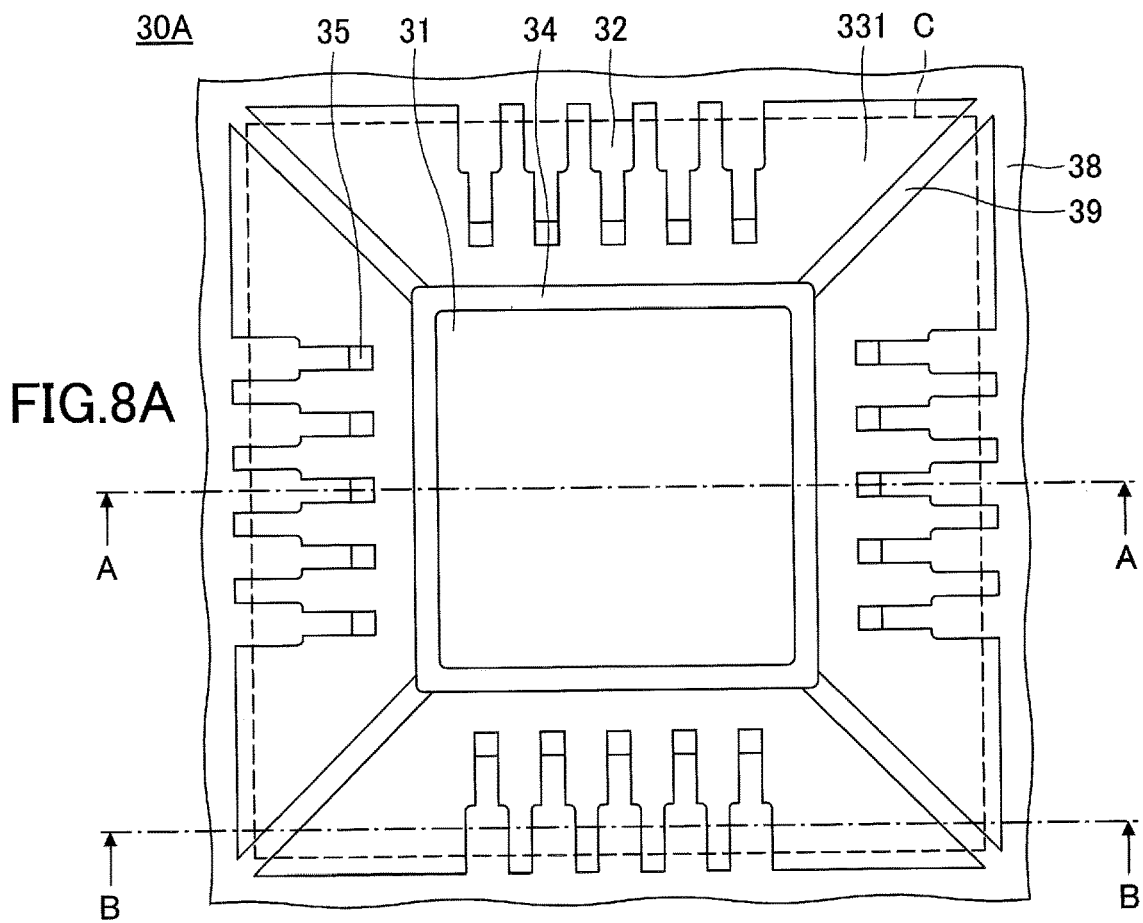
FIG. 8A, FIG. 8B, and FIG. 8C are diagrams illustrating an example of the unit substrate forming the substrate for semiconductor elements in a first modification of the first embodiment.
Figure 8B:
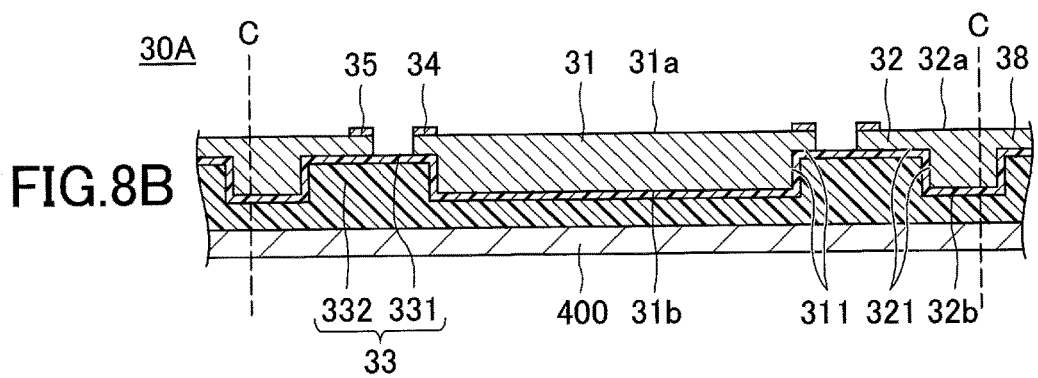
Figure 8C:
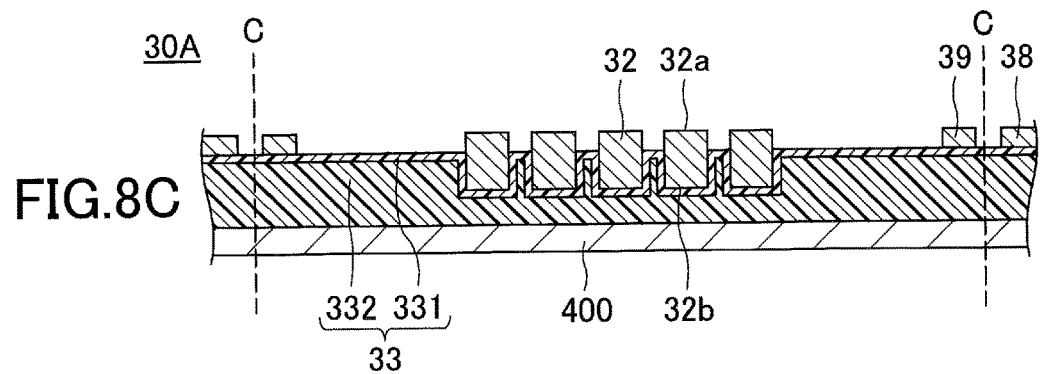

FIG. 8A, FIG. 8B, and FIG. 8C are diagrams illustrating an example of the unit substrate forming the substrate for semiconductor elements in the first modification of the first embodiment. FIG. 8A illustrates a plan view, FIG. 8B illustrates a cross section along a line A-A in FIG. 8A, and FIG. 8C illustrates a cross section along a line B-B in FIG. 8A.

As illustrated in FIG. 8A through FIG. 8C, a unit substrate 30A differs from the unit substrate 30 illustrated in FIG. 2A through FIG. 2C, in that a stacked structure made up of the metal film 400, the second resin 332, and the first resin 331, is adhered to the lower surface 31b of the die pad 31 and the lower surfaces 32b of the leads 32.

In the unit substrate 30A, the resin part 33 is provided to fill the regions in which the die pad 31, the leads 32, the frame part 38, and the support bars 39 are not provided in the plan view, similarly as in the case of the unit substrate 30. In addition, the resin part 33 is provided to fill the cutout parts 311 and 321, and to cover the lower surfaces of the frame part 38 and the support bars 39 that are half-etched. However, unlike the unit substrate 30, the resin part 33 in the unit substrate 30A covers the lower surface 31b of the die pad 31 and the lower surfaces 32b of the leads 32.

More particularly, the second resin 332 is formed on the metal film 400, and the first resin 331 is formed on the second resin 332. The first resin 331 extends from inside the cutout part 311 to the lower surface 31b of the die pad 31, to directly cover the entire lower surface 31b of the die pad 31. In addition, the first resin 331 extends from inside the cutout part 321 to the lower surfaces 32b of the leads 32, to directly cover the entire lower surfaces 32b of the leads 32. The second resin 332 is arranged to stretch over the first resin 331 that extends from inside the cutout part 311, to directly cover the lower surface 31b of the die pad 31. In addition, the second resin 332 is arranged to stretch over the first resin 331 that extends from inside the cutout part 321, to directly cover the lower surfaces 32b of the leads 32.

Figure 9A:
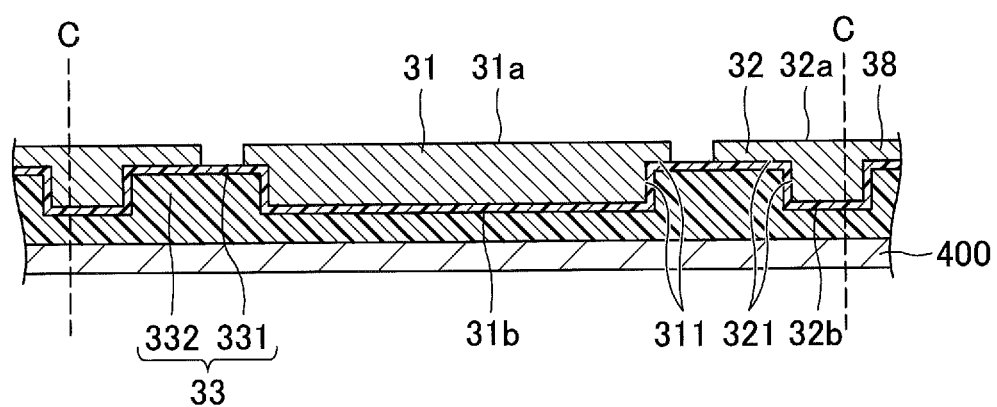
FIG. 9A and FIG. 9B are diagrams illustrating examples of manufacturing processes of the substrate for semiconductor elements in the first modification of the first embodiment.
Figure 9B:
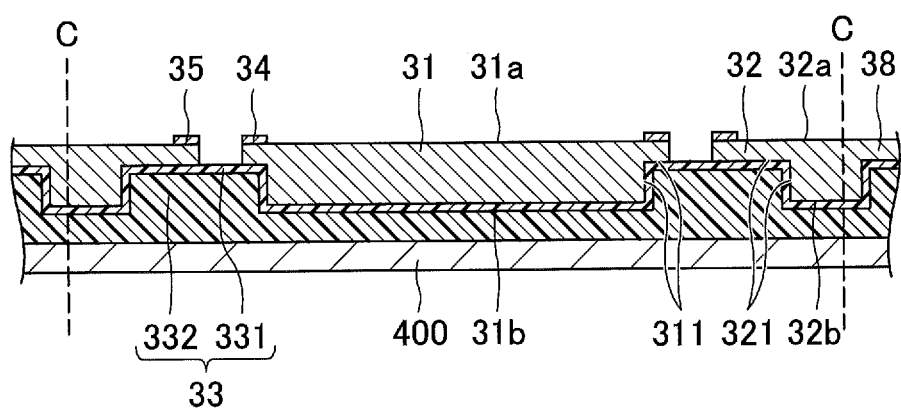

FIG. 9A and FIG. 9B are diagrams illustrating examples of manufacturing processes of the substrate for semiconductor elements in the first modification of the first embodiment. FIG. 9A and FIG. 9B are cross sections corresponding to the cross section illustrated in FIG. 8B. When manufacturing the substrate 1 for semiconductor elements, in which the unit substrates 30A are arranged in the matrix arrangement, processes similar to the processes of the first embodiment described in conjunction with FIG. 4A through FIG. 5C are performed, to manufacture a stacked structure illustrated in FIG. 9A.

Next, in the process illustrated in FIG. 9B, the metal layer 34 is formed in a predetermined region on the upper surface 31a of the die pad 31, and the metal layer 35 is formed in predetermined regions on the upper surfaces 32a of the leads 32, similarly to the processes described in conjunction with FIG. 6A through FIG. 6C. Hence, the substrate 1 for semiconductor elements illustrated in FIG. 1, in which the unit substrates 30A are arranged in the matrix arrangement, is completed. In this modification of the first embodiment, a process corresponding to the process illustrated in FIG. 5D is not performed in the manufacturing process of the substrate 1 for semiconductor elements.

Figure 10A:
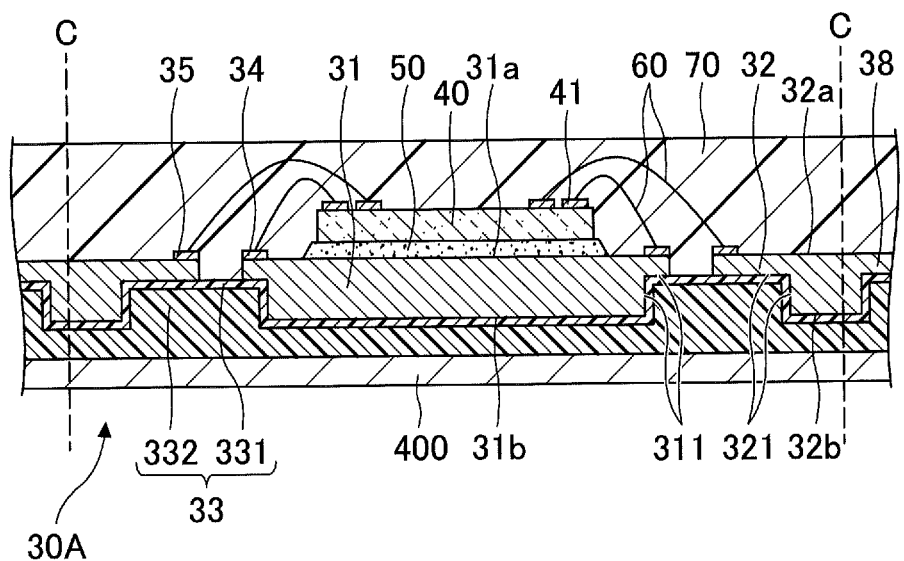
FIG. 10A, FIG. 10B, and FIG. 10C are diagrams illustrating examples of manufacturing processes of the semiconductor device in the first modification of the first embodiment.
Figure 10B:
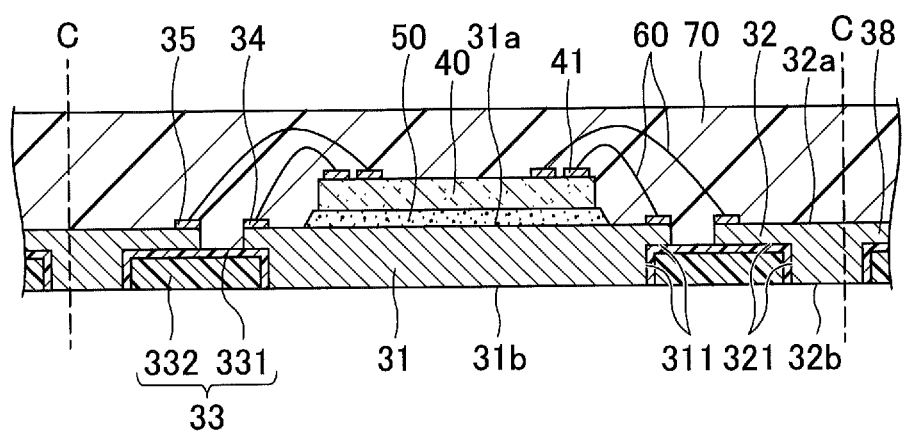
Figure 10C:
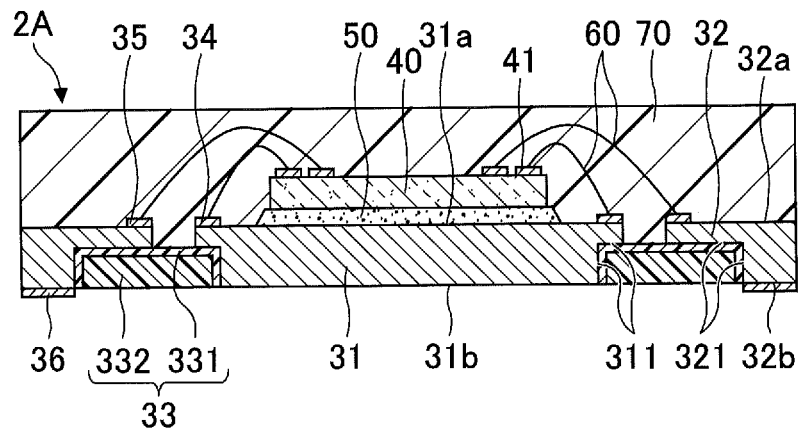

The manufacturing process of the semiconductor device, including mounting of the semiconductor element on the unit substrate 30A, will now be described, by referring to FIG. 10A through FIG. 10C. FIG. 10A, FIG. 10B, and FIG. 10C are diagrams illustrating examples of manufacturing processes of the semiconductor device in the first modification of the first embodiment. First, processes similar to the processes of the first embodiment described in conjunction with FIG. 7A through 7C are performed, except that the unit substrate 30A is used in place of the unit substrate 30, to manufacture a stacked structure illustrated in FIG. 10A.

In the process illustrated in FIG. 10B, the metal film 400 is removed by a process similar to the process described in conjunction with FIG. 5D. Then, the resin part 33 formed below the lower surface 31b of the die pad 31 and the lower surfaces 32b of the leads 32 is removed, to expose the lower surface 31b of the die pad 31 and the lower surfaces 32b of the leads 32. For example, the lower surface of the resin part 33, from which unwanted parts are removed, is located on the same plane as the lower surface 31b of the die pad 31 and the lower surfaces 32b of the leads 32.

Next, in the process illustrated in FIG. 10C, the metal layer 36 for external connection is formed on the lower surfaces 32b of the leads 32, and the unit substrates 30A are thereafter cut at the cutting positions C into the individual pieces, to complete a plurality of semiconductor devices 2A, similarly to the process described in conjunction with FIG. 7D. The semiconductor device 2A has the same structure as the semiconductor device 2.

The semiconductor device 2A may be delivered as one product. Alternatively, the substrate 1 for semiconductor elements, in the state before being cut into the individual pieces, and including the unit substrates 30A illustrated in FIG. 8A through FIG. 8C, may be delivered as one product. In the latter case, the substrate 1 for semiconductor elements, delivered to the destination as one product, may be subjected to each of the processes described above in conjunction with FIG. 10A through FIG. 10C at the destination to manufacture the plurality of semiconductor devices 2A.

By maintaining the metal film 400 on the unit substrate 30A until the latter stages of the manufacturing process of the semiconductor device 2A, it is possible to improve the rigidity or strength of the product during the manufacturing process, to enable a stable process to be performed at each stage of the manufacturing process.

Second Modification of First Embodiment

In a second modification of the first embodiment, the substrate for semiconductor elements is provided with another resin part. When describing the second modification of the first embodiment, a description of those parts that are the same as those corresponding parts of the first embodiment and the first modification of the first embodiment may be omitted.

Figure 11A:
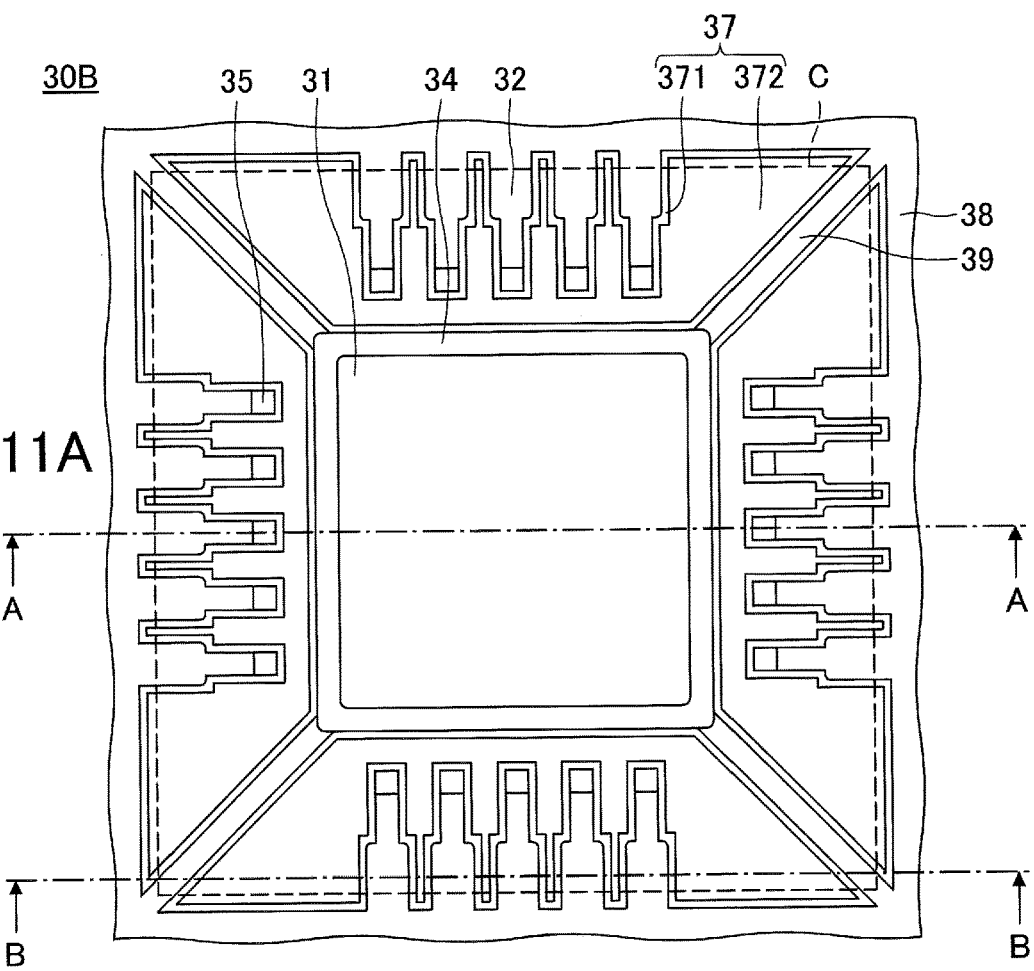
FIG. 11A, FIG. 11B, and FIG. 11C are diagrams illustrating an example of the unit substrate forming the substrate for semiconductor elements in a second modification of the first embodiment.
Figure 11B:
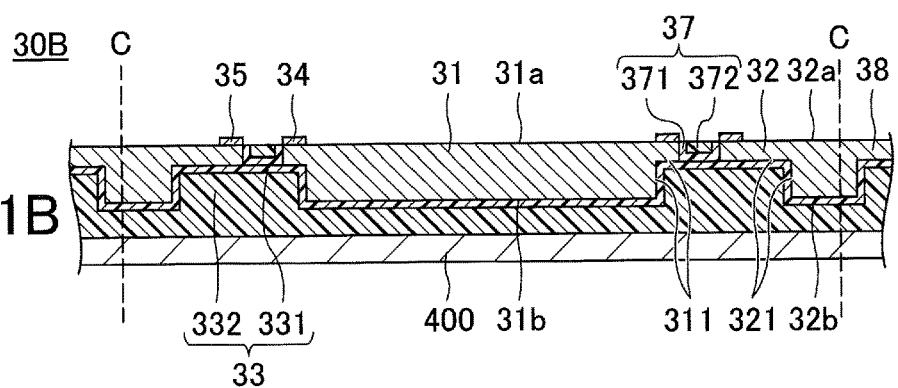
Figure 11C:
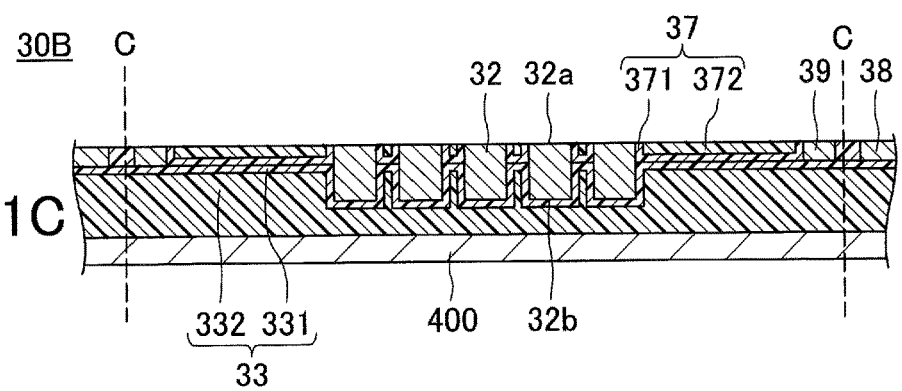

FIG. 11A through FIG. 11C are diagrams illustrating an example of the unit substrate forming the substrate for semiconductor elements in the second modification of the first embodiment. FIG. 11A illustrates a plan view, FIG. 11B illustrates a cross section along a line A-A in FIG. 11A, and FIG. 11C illustrates a cross section along a line B-B in FIG. 11A.

As illustrated in FIG. 11A through FIG. 11C, a unit substrate 30B differs from the unit substrate 30A illustrated in FIG. 8A through FIG. 8C, in that the unit substrate 30B includes another resin part 37. The resin part 37 is formed on regions of the resin part 33 where the die pad 31, the leads 32, the frame part 38, and the support bars 39 are not provided.

In the plan view, the resin part 37 is provided on the upper surface of the resin part 33 so as to fill the regions where the die pad 31, the leads 32, the frame part 38, and the support bars 39 are not provided. More particularly, the resin part 37 has a multi-layer structure, or a laminated structure, including a third resin 371 and a fourth resin 372. The third resin 371 is arranged to make contact with the side surfaces of the die pad 31 exposed from the resin part 33, the side surfaces along the longitudinal direction of the leads 32 exposed from the resin part 33, the end surfaces of the leads 32 opposing the die pad 31 and exposed from the resin part 33, the inner sidewalls of the frame part 38, the side surfaces of the support bars 39, and the upper surface of the first resin 331.

In addition, the fourth resin 372 is arranged to sandwich the third resin 371 between the fourth resin 372 and each of the side surfaces of the die pad 31 exposed from the resin part 33, the side surfaces along the longitudinal direction of the leads 32 exposed from the resin part 33, the end surfaces of the leads 32 opposing the die pad 31 and exposed from the resin part 33, the inner sidewalls of the frame part 38, the side surfaces of the support bars 39, and the upper surface of the first resin 331. The resin part 37 exposes the upper surface 31a of the die pad 31, the upper surfaces 32a of the leads 32, the upper surface of the frame part 38, and the upper surfaces of the support bars 39.

The third resin 371 and the fourth resin 372 may be made of a material such as an epoxy resin, a polyimide resin, or the like. The third resin 371 and the fourth resin 372 include a filler, such as silica, alumina, or the like, for example. An amount of the filler included in the third resin 371 is smaller than an amount of the filler included in the fourth resin 372. A type of the filler included in the third resin 371 may be the same as, or may be different from, a type of the filler included in the fourth resin 372.

By reducing the amount of the filler included in the third resin 371 in contact with the die pad 31, the leads 32, the frame part 38, and the support bars 39, it is possible to increase a contact area of a resin part (part excluding the filler) forming the third resin 371 and the die pad 31, the leads 32, the frame part 38, and the support bars 39. For this reason, it is possible to improve the adhesion of the third resin 371 with respect to the die pad 31, the leads 32, the frame part 38, and the support bars 39.

On the other hand, by increasing the amount of the filler included in the fourth resin 372, it is possible to easily adjust the coefficient of thermal expansion of the resin part 37. For example, when the amount of the filler included in the fourth resin 372 is adjusted so that the coefficient of thermal expansion of the resin part 37 becomes approximately the same as the coefficients of expansion of the die pad 31, the leads 32, the frame part 38, and the support bars 39, it is possible to reduce warping of the substrate 1 for semiconductor elements.

Figure 12A:
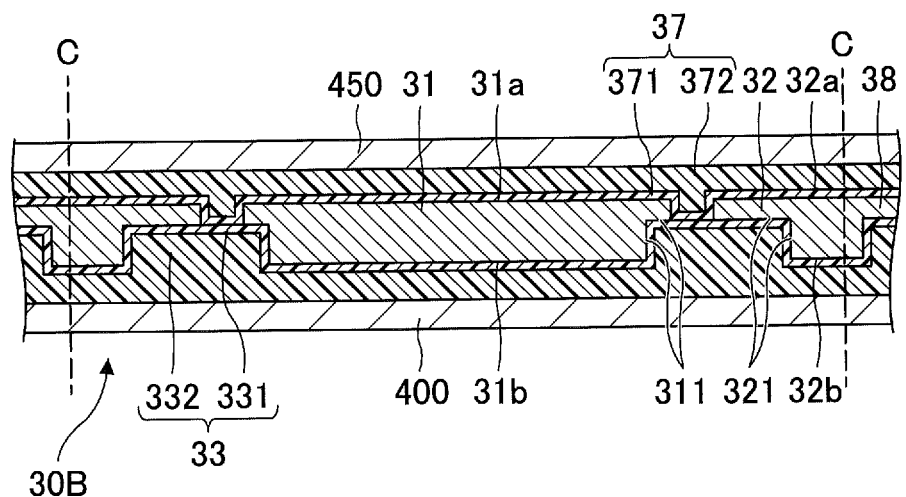
FIG. 12A, FIG. 12B, and FIG. 12C are diagrams illustrating examples of manufacturing processes of the substrate for semiconductor elements in the second modification of the first embodiment.
Figure 12B:
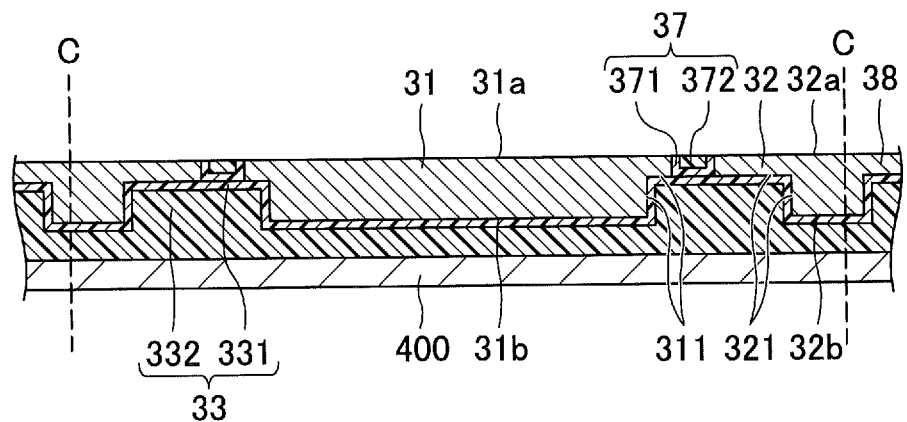
Figure 12C:
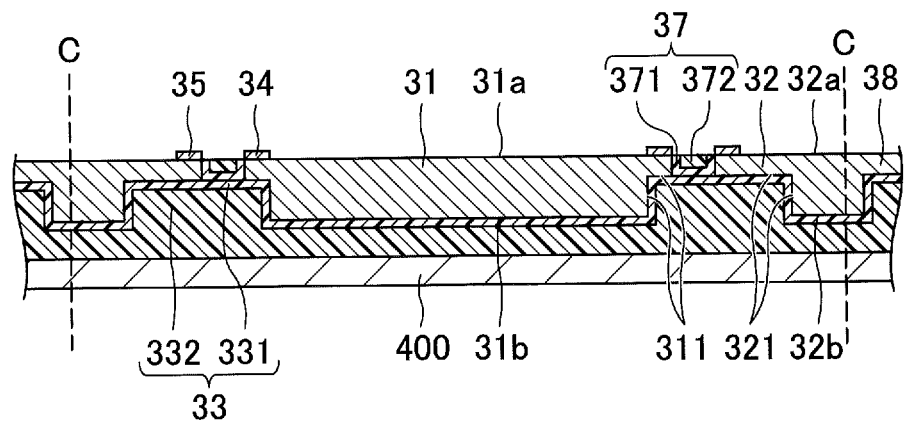

FIG. 12A, FIG. 12B, and FIG. 12C are diagrams illustrating examples of manufacturing processes of the substrate for semiconductor elements in the second modification of the first embodiment. FIG. 12A through FIG. 12C are cross sections corresponding to the cross section illustrated in FIG. 11B. When manufacturing the substrate 1 for semiconductor elements, in which the unit substrates 30B are arranged in the matrix arrangement, processes similar to the processes of the first embodiment described in conjunction with FIG. 4A through FIG. 5C are performed, to manufacture a stacked structure illustrated in FIG. 9A.

Next, in the process illustrated in FIG. 12A, the resin part 37, provided on a metal film 450, is prepared. The resin part 37 has the multi-layer structure in which the fourth resin 372 and the third resin 371 are successively stacked on the metal film 450. At this stage of the manufacturing process, the fourth resin 372 and the third resin 371 are in the B-stage state (semi-cured state). In a case in which surface roughnesses of upper and lower surfaces of the metal film 450 are different, the resin part 37 is preferably provided on the surface having the smaller surface roughness, in order to facilitate separation of the metal film 450 from the resin part 37 at a later stage of the manufacturing process.

The metal film 450 may be a copper film having a thickness of approximately 12 µm to approximately 25 µm, for example. The third resin 371 and the fourth resin 372 may be an epoxy resin, a polyimide resin, or the like, for example. The third resin 371 may have a thickness of approximately 10 µm to approximately 30 µm, for example. The fourth resin 372 may have a thickness of approximately 30 µm to approximately 50 µm, for example. The third resin 371 and the fourth resin 372 include a filler such as silica, alumina, or the like, for example. The amount of the filler included in the third resin 371 is smaller than the amount of the filler included in the fourth resin 372.

Next, the resin part 37 is adhered on the upper surface 31a of the die pad 31, the upper surfaces 32a of the leads 32, the upper surface of the frame part 38, and the upper surfaces of the support bars 39. In addition, the resin part 37 fills the regions on the resin part 33 where the die pad 31, the leads 32, the frame part 38, and the support bars 39 are not provided. More particularly, the metal film 450 on which the resin part 37 is stacked, is arranged so that the third resin 371 opposes the upper surface 31a of the die pad 31, the upper surfaces 32a of the leads 32, the upper surface of the frame part 38, and the upper surfaces of the support bars 39, and the metal film 450 is pressed toward the metal film 400. The third resin 371 and the fourth resin 372 in the B-stage state are deformed to fill the regions on the resin part 33 where the die pad 31, the leads 32, the frame part 38, and the support bars 39 are not provided.

In this state, only the third resin 371 forming the upper layer of the resin part 37 makes contact with the side surfaces of the die pad 31 exposed from the resin part 33, the side surfaces along the longitudinal direction of the leads 32 exposed from the resin part 33, the end surfaces of the leads 32 opposing the die pad 31 and exposed from the resin part 33, the inner sidewalls of the frame part 38, the side surfaces of the support bars 39, and the upper surface of the first resin 331. Thereafter, the third resin 371 and the fourth resin 372 are cured by being heated to the curing temperature or higher. The third resin 371 and the fourth resin 372 may be heated while pressing the metal film 450 against the metal layer 400.

Next, in the process illustrated in FIG. 12B, the metal film 450 is first removed. Because the amount of the filler included in the fourth resin 372 in contact with the metal film 450 is large, the adhesion between the fourth resin 372 and the metal film 450 is poor. For this reason, the metal film 450 can be mechanically removed from the fourth resin 372 with ease. Of course, the metal film 450 may be removed by buffing, wet blasting, or the like.

After removing the metal film 450, the resin part 37 formed on the upper surface 31a of the die pad 31, the upper surfaces 32a of the leads 32, the upper surface of the frame part 38, and the upper surfaces of the support bars 39 is removed, to expose the upper surface 31a of the die pad 31, the upper surfaces 32a of the leads 32, the upper surface of the frame part 38, and the upper surfaces of the support bars 39. For example, the upper surface of the resin part 37, from which unwanted parts are removed, is located on the same plane as the upper surface 31a of the die pad 31, the upper surfaces 32a of the leads 32, the upper surface of the frame part 38, and the upper surfaces of the support bars 39. The resin part 37 may be removed by buffing, wet blasting, or the like, similarly as in the case of the process described in conjunction with FIG. 5D.

In a case in which the buffing compound, the abrasive, or the like remains on the upper surface 31a of the die pad 31, the upper surfaces 32a of the leads 32, the upper surface of the frame part 38, and the upper surfaces of the support bars 39, the soft etching is preferably performed to remove the residual buffing compound, abrasive, or the like on the upper surface 31a of the die pad 31, the upper surfaces 32a of the leads 32, the upper surface of the frame part 38, and the upper surfaces of the support bars 39. In the case in which the die pad 31, the leads 32, the frame part 38, and the support bars 39 are made of copper, the soft etching can be performed using the cupric chloride solution, for example. When the soft etching is performed to remove the residual buffing compound, abrasive, or the like, the upper surface 31a of the die pad 31, the upper surfaces 32a of the leads 32, the upper surface of the frame part 38, and the upper surfaces of the support bars 39 cave in slightly from the upper surface of the resin part 37.

Next, in the process illustrated in FIG. 12C, the metal layer 34 is formed in the predetermined region on the upper surface 31a of the die pad 31, and the metal layer 35 is formed in the predetermined regions on the upper surfaces 32a of the leads 32, similarly to the processes described in conjunction with FIG. 6A through FIG. 6C. Hence, the substrate 1 for semiconductor elements illustrated in FIG. 1, in which the unit substrates 30B are arranged in the matrix arrangement, is completed.

Figure 13A:
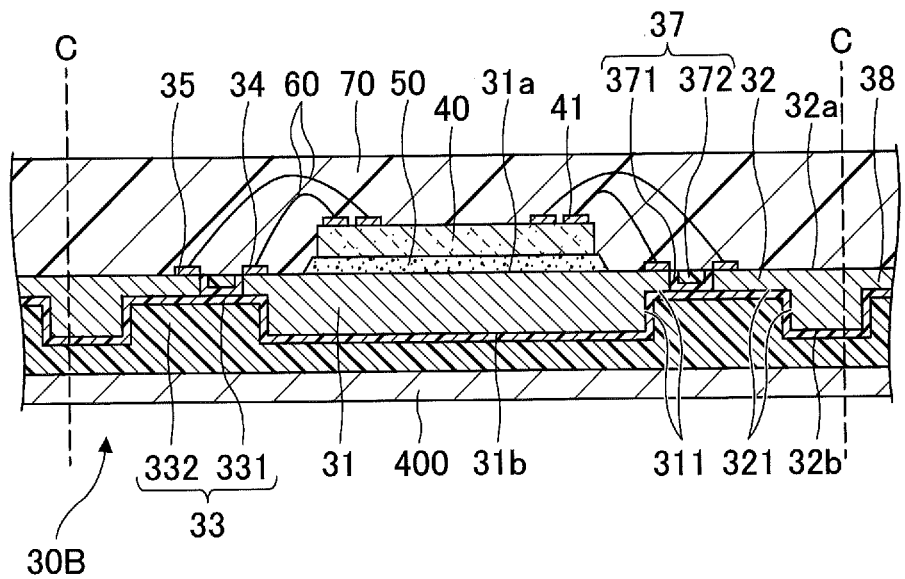
FIG. 13A, FIG. 13B, and FIG. 13C are diagrams illustrating examples of manufacturing processes of the semiconductor device in the second modification of the first embodiment.
Figure 13B:
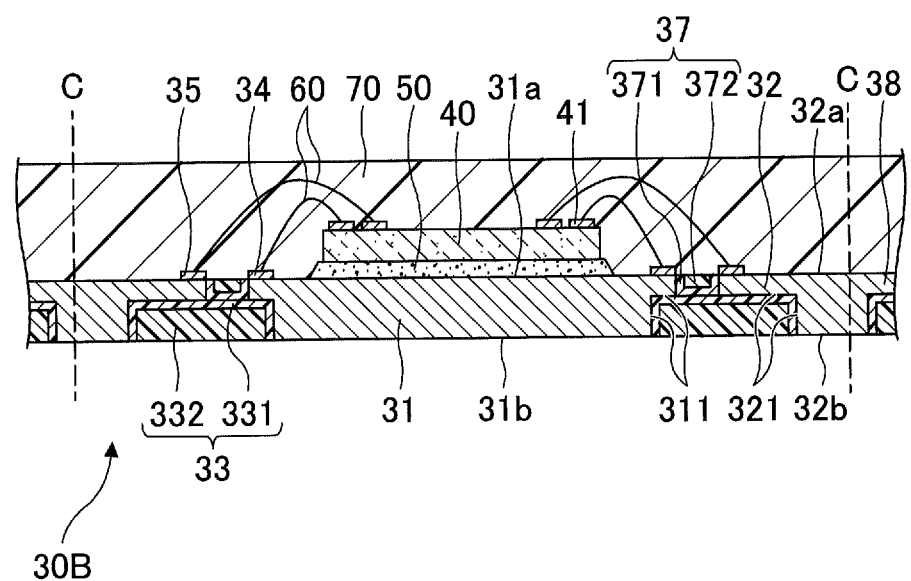
Figure 13C:
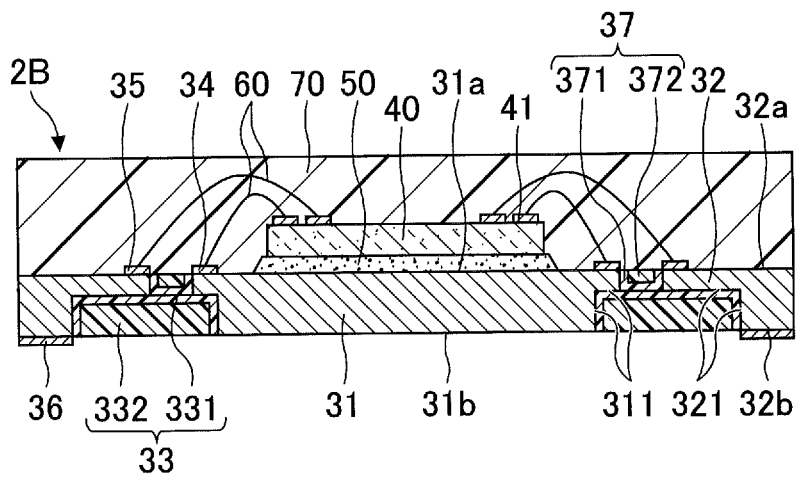

The manufacturing process of the semiconductor device, including mounting of the semiconductor element on the unit substrate 30B, will now be described, by referring to FIG. 13A through FIG. 13C. FIG. 13A, FIG. 13B, and FIG. 13C are diagrams illustrating examples of manufacturing processes of the semiconductor device in the second modification of the first embodiment. First, processes similar to the processes of the first embodiment described in conjunction with FIG. 7A through 7C are performed, except that the unit substrate 30B is used in place of the unit substrate 30, to manufacture a stacked structure illustrated in FIG. 13A.

Next, in the process illustrated in FIG. 13B, the metal film 400 is removed by a process similar to the process described in conjunction with FIG. 5D. Then, the resin part 33 formed below the lower surface 31b of the die pad 31 and the lower surfaces 32b of the leads 32 is removed. For example, the lower surface of the resin part 33, from which unwanted parts are removed, is located on the same plane as the lower surface 31b of the die pad 31 and the lower surfaces 32b of the leads 32.

Next, in the process illustrated in FIG. 13C, the metal layer 36 for external connection is formed on the lower surfaces 32b of the leads 32, and the unit substrates 30B are thereafter cut at the cutting positions C into the individual pieces, to complete a plurality of semiconductor devices 2B, similarly to the process described in conjunction with FIG. 7D.

The semiconductor device 2B may be delivered as one product. Alternatively, the substrate 1 for semiconductor elements, in the state before being cut into the individual pieces, and including the unit substrates 30B illustrated in FIG. 11A through FIG. 11C, may be delivered as one product. In the latter case, the substrate 1 for semiconductor elements, delivered to the destination as one product, may be subjected to each of the processes described above in conjunction with FIG. 13A through FIG. 13C at the destination to manufacture the plurality of semiconductor devices 2B.

By filling the resin part 37 into the regions on the resin part 33 where the die pad 31, the leads 32, the frame part 38, and the support bars 39 are not provided, it is possible to improve the rigidity or strength of the product during the manufacturing process, and further reduce warping of the substrate 1 for semiconductor elements.

In addition, by maintaining the metal film 400 on the unit substrate 30B until the latter stages of the manufacturing process of the semiconductor device 2B, it is possible to improve the rigidity or strength of the product during the manufacturing process, to enable a stable process to be performed at each stage of the manufacturing process.

Figure 14:
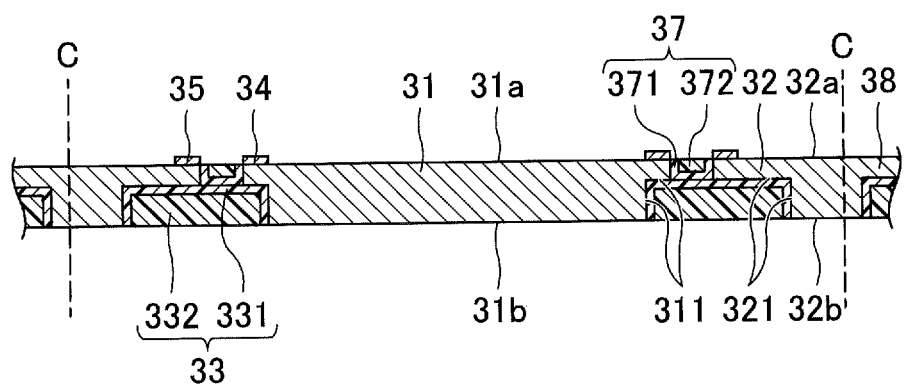
FIG. 14 is a diagram illustrating an example of the manufacturing process of the substrate for semiconductor elements in the second modification of the first embodiment.

After the process illustrated in FIG. 12C, the metal film 400 may be removed, and the resin part 33 formed below the lower surface 31b of the die pad 31 and the lower surfaces 32b of the leads 32 may be removed, as illustrated in FIG. 14, similarly as in the case of the first embodiment. In this case, the metal film 400 is not provided during the manufacturing process of the semiconductor device 2B. However, the stable process can be performed at each stage of the manufacturing process because the rigidity or strength of the product is improved by the provision of the resin part 37.

Third Modification of First Embodiment

In a third modification of the first embodiment, the substrate for semiconductor elements is provided with a plurality of metal layers on the upper surface of the die pad. When describing the third modification of the first embodiment, a description of those parts that are the same as those corresponding parts of the first embodiment may be omitted.

Figure 15A:
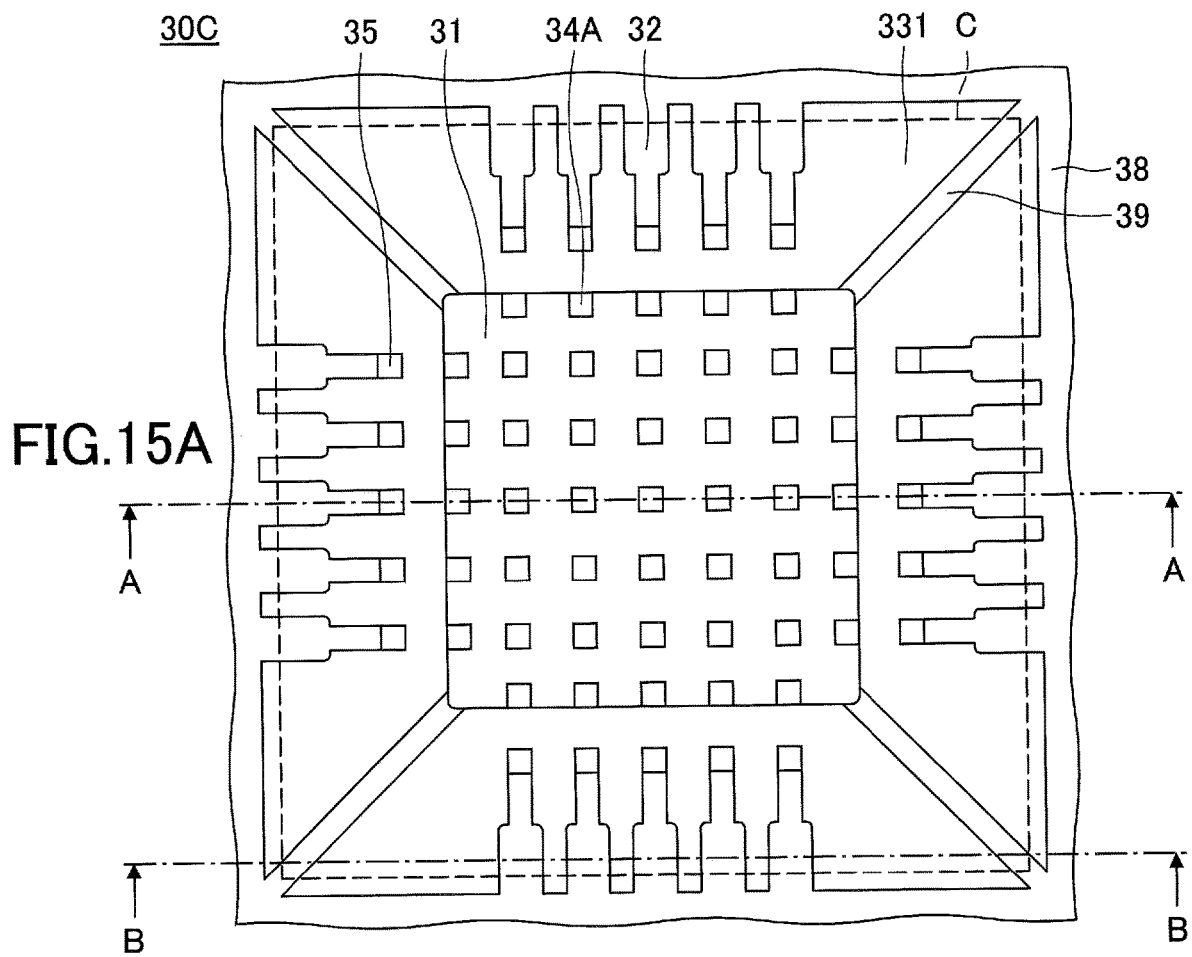
FIG. 15A, FIG. 15B, and FIG. 15C are diagrams illustrating an example of the unit substrate forming the substrate for semiconductor elements in a third modification of the first embodiment.
Figure 15B:
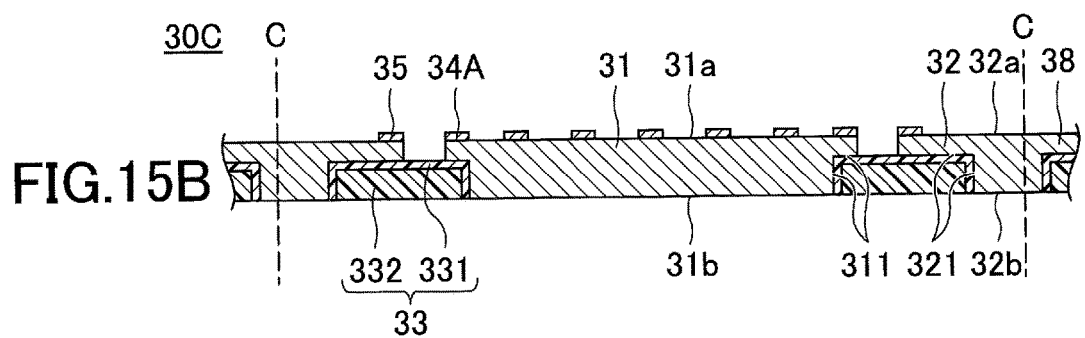
Figure 15C:
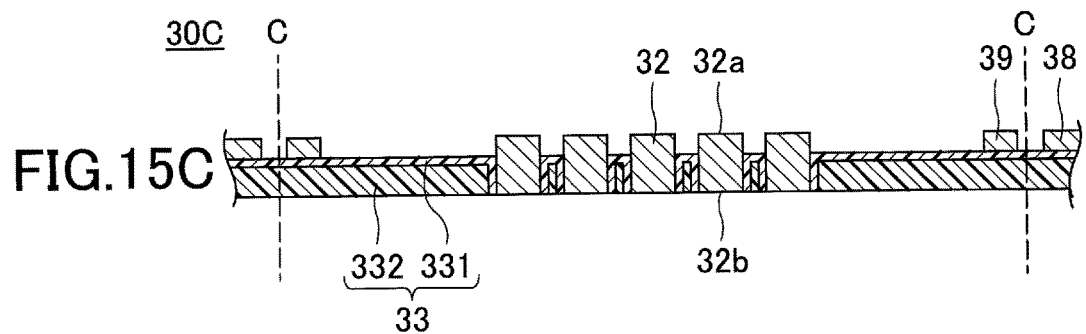

FIG. 15A through FIG. 15C are diagrams illustrating an example of the unit substrate forming the substrate for semiconductor elements in the third modification of the first embodiment. FIG. 15A illustrates a plan view, FIG. 15B illustrates a cross section along a line A-A in FIG. 15A, and FIG. 15C illustrates a cross section along a line B-B in FIG. 15A.

As illustrated in FIG. 15A through FIG. 15C, a unit substrate 30C differs from the unit substrate 30 illustrated in FIG. 2A through FIG. 2C, in that the unit substrate 30C includes a plurality of metal layers 34A formed on the upper surface 31a of the die pad 31.

The plurality of metal layers 34A are arranged vertically and horizontally, in an area array, on the upper surface 31a of the die pad 31. The unit substrate 30C may be manufactured by processes similar to the processes of the first embodiment described in conjunction with FIG. 4A through FIG. 6C. However, in the process illustrated in FIG. 6A, the photoresist 340 is patterned in correspondence with the regions where the metal films 34A illustrated in FIG. 15A are formed. The metal layers 34A may be made of the same metal material as the metal layer 34, for example. The metal layers 34A and the metal layer 35 may be used as pads for flip-chip bonding to the electrodes of the semiconductor element via solder bumps or the like.

Figure 16A:
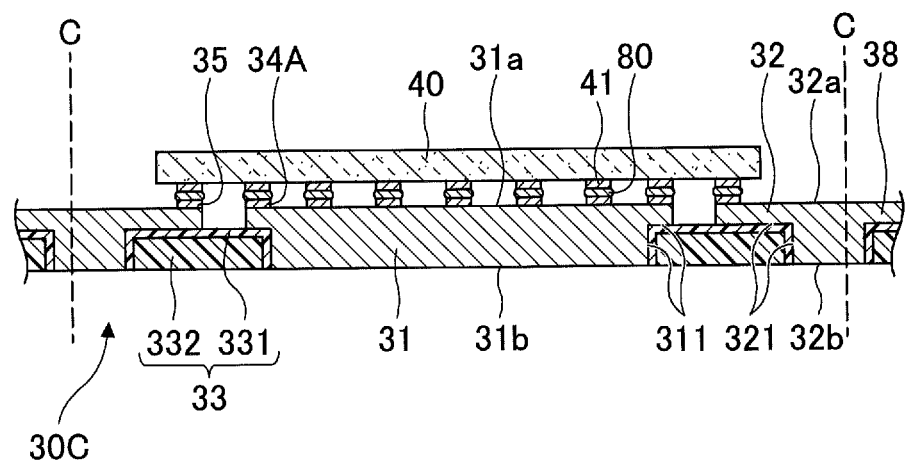
FIG. 16A, FIG. 16B, and FIG. 16C are diagrams illustrating examples of manufacturing processes of the semiconductor device in the third modification of the first embodiment.
Figure 16B:
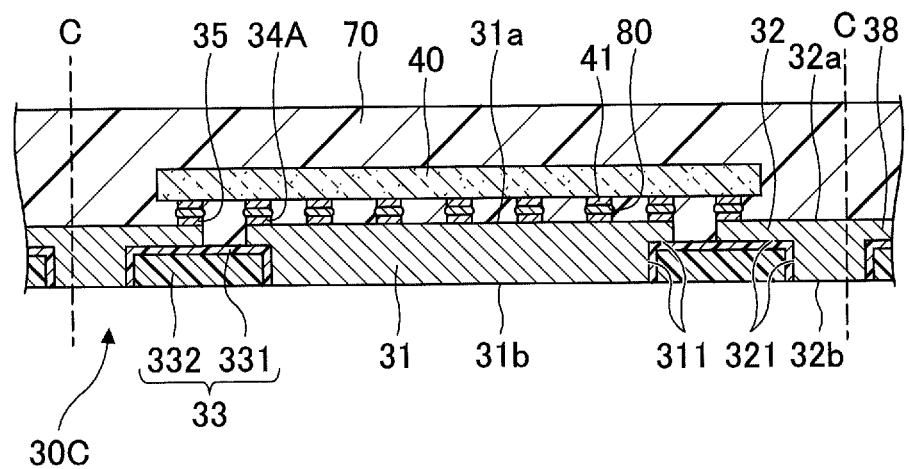
Figure 16C:
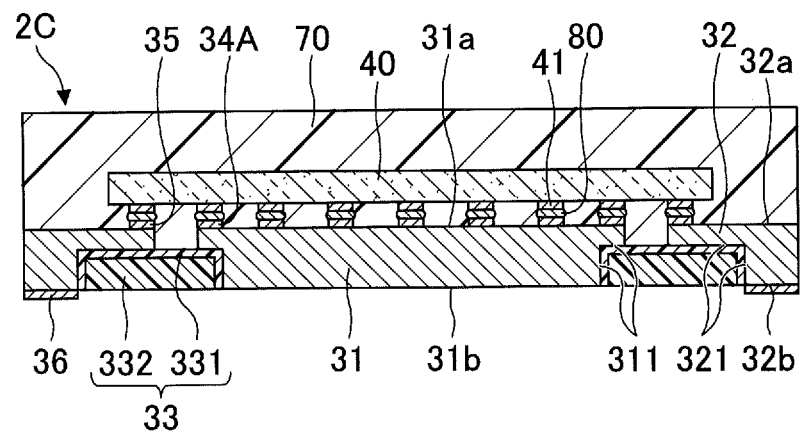

The manufacturing process of the semiconductor device, including mounting of the semiconductor element on the unit substrate 30C, will now be described, by referring to FIG. 16A through FIG. 16C. FIG. 16A, FIG. 16B, and FIG. 16C are diagrams illustrating examples of manufacturing processes of the semiconductor device in the third modification of the first embodiment. First, in the process illustrated in FIG. 16A, the semiconductor element 40 in a face-down state is mounted on each unit substrate 30C. More particularly, the electrode terminals 41 formed on the circuit forming surface of the semiconductor element 40 are electrically connected to the metal layers 34A and 35, via solder bumps 80.

Next, in the process illustrated in FIG. 16B, the encapsulating resin 70 is formed to encapsulate each unit substrate 30C, the semiconductor element 40, and the solder bumps 80 by a process similar to the process described in conjunction with in FIG. 7C. The encapsulating resin 70 may be formed to expose a back surface of the semiconductor element 40. In addition, an underfill resin may fill spaces between the semiconductor element 40 and the unit substrate 30C, before forming the encapsulating resin 70.

Next, in the process illustrated in FIG. 16C, the metal layer 36 for external connection is formed on the lower surfaces 32b of the leads 32, and the unit substrates 30C are thereafter cut at the cutting positions C into the individual pieces, to complete a plurality of semiconductor devices 2C, similarly to the process described in conjunction with FIG. 7D. The electrode terminals 41 that are connected to the metal layer 34A via the solder bumps 80 may be fixed to the ground potential GND, by connecting the die pad 31 to the ground GND, for example.

The semiconductor device 2C may be delivered as one product. Alternatively, the substrate 1 for semiconductor elements, in the state before being cut into the individual pieces, and including the unit substrates 30C illustrated in FIG. 15A through FIG. 15C, may be delivered as one product. In the latter case, the substrate 1 for semiconductor elements, delivered to the destination as one product, may be subjected to each of the processes described above in conjunction with FIG. 16A through FIG. 16C at the destination to manufacture the plurality of semiconductor devices 2C.

According to this modification, it is possible to manufacture the semiconductor device 2C in which the semiconductor element 40 is flip-chip bonded on the unit substrate 30C.

Similarly as in the case of the first modification of the first embodiment, the stacked structure made up of the metal film 400, the second resin 332, and the first resin 331, may be adhered to the lower surface 31b of the die pad 31 and the lower surfaces 32b of the leads 32. In this case, in the manufacturing process of the semiconductor device 2C, the resin part 33 formed below the lower surface 31b of the die pad 31 and the lower surfaces 32b of the leads 32 is removed after removing the metal film 400.

Fourth Modification of First Embodiment

In a fourth modification of the first embodiment, the substrate for semiconductor elements is not provided with the die pad, the support bars, or the like. When describing the fourth modification of the first embodiment, a description of those parts that are the same as those corresponding parts of the first embodiment and the modifications thereof may be omitted.

Figure 17A:
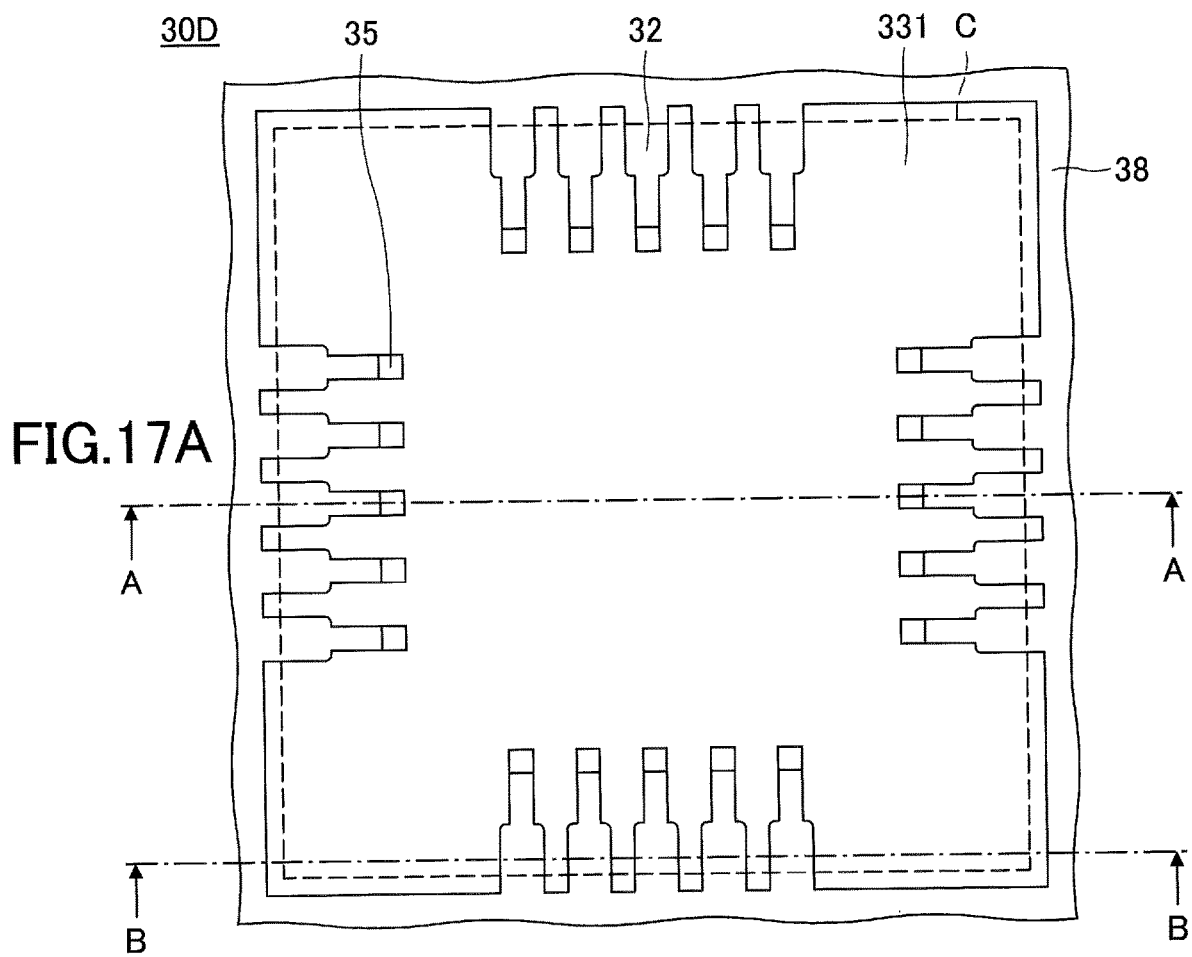
FIG. 17A, FIG. 17B, and FIG. 17C are diagrams illustrating an example of the unit substrate forming the substrate for semiconductor elements in a fourth modification of the first embodiment.
Figure 17B:
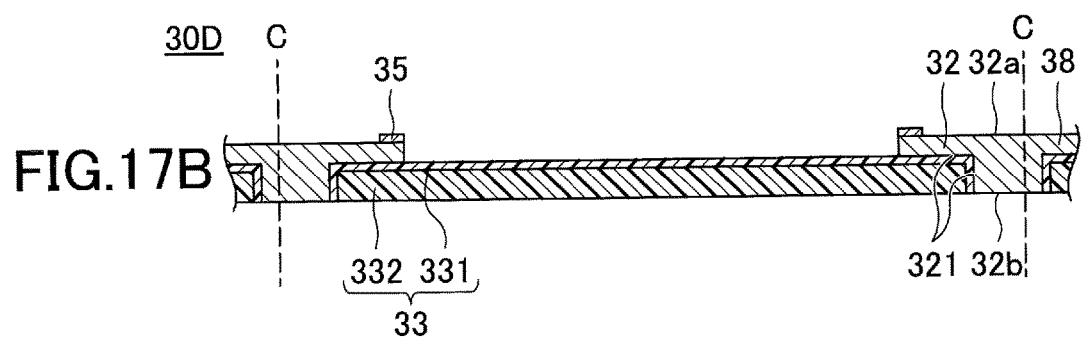
Figure 17C:
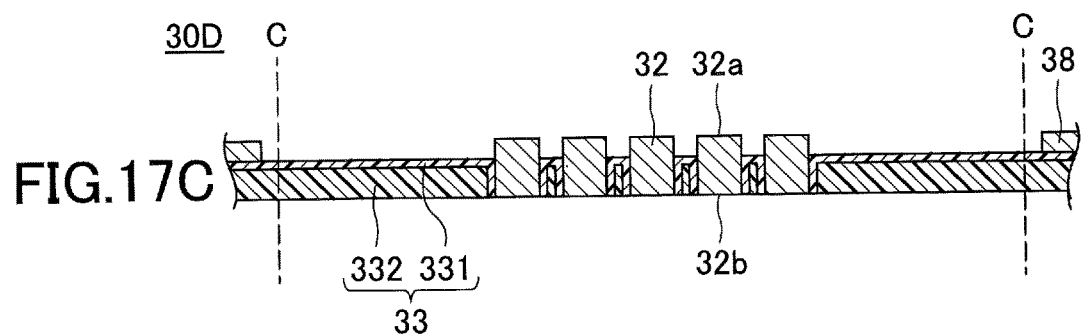

FIG. 17A through FIG. 17C are diagrams illustrating an example of the unit substrate forming the substrate for semiconductor elements in the fourth modification of the first embodiment. FIG. 17A illustrates a plan view, FIG. 17B illustrates a cross section along a line A-A in FIG. 17A, and FIG. 17C illustrates a cross section along a line B-B in FIG. 17A.

As illustrated in FIG. 17A through FIG. 17C, a unit substrate 30D differs from the unit substrate 30C illustrated in FIG. 15A through FIG. 15C, in that the unit substrate 30D is not provided with the die pad 31, the metal layers 34A, and the support bars 39. Because the unit substrate 30D includes no die pad 31, no cutout part 311 is provided. In addition, the resin part 33 fills the region where the lower surface 31b of the die pad 31 is arranged in the unit substrate 30C.

Figure 18:
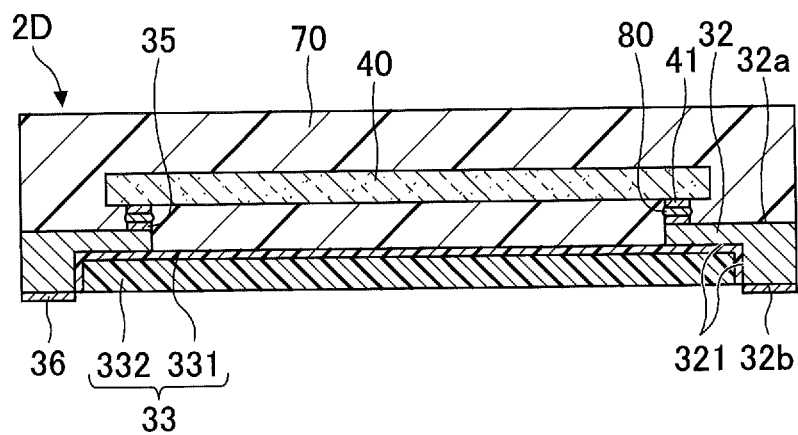
FIG. 18 is a diagram illustrating an example of a manufacturing process of the substrate for semiconductor elements in the fourth modification of the first embodiment.

FIG. 18 is a diagram illustrating an example of a manufacturing process of the substrate for semiconductor elements in the fourth modification of the first embodiment. FIG. 18 illustrates a cross section corresponding to the cross section illustrated in FIG. 17B. When manufacturing the substrate 1 for semiconductor elements, in which the unit substrates 30D are arranged in the matrix arrangement, a process similar to the process described in conjunction with FIG. 16A is performed, to mount the semiconductor element 40 in the face-down state on each unit substrate 30D. More particularly, the electrode terminals 41 formed on the circuit forming surface of the semiconductor element 40 are electrically connected to the metal layer 35, via the solder bumps 80.

Next, the encapsulating resin 70 is formed to encapsulate each unit substrate 30D, the semiconductor element 40, and the solder bumps 80 by a process similar to the process described in conjunction with FIG. 16B. The encapsulating resin 70 may be formed to expose the back surface of the semiconductor element 40. In addition, the underfill resin may fill spaces between the semiconductor element 40 and the unit substrate 30D, before forming the encapsulating resin 70.

Next, in the process illustrated in FIG. 18, the metal layer 36 for external connection is formed on the lower surfaces 32b of the leads 32, and the unit substrates 30D are thereafter cut at the cutting positions C into the individual pieces, to complete a plurality of semiconductor devices 2D, similarly to the process described in conjunction with FIG. 16C.

The semiconductor device 2D may be delivered as one product. Alternatively, the substrate 1 for semiconductor elements, in the state before being cut into the individual pieces, and including the unit substrates 30D illustrated in FIG. 17A through FIG. 17C, may be delivered as one product. In the latter case, the substrate 1 for semiconductor elements, delivered to the destination as one product, may be subjected to the processes including the process described above in conjunction with FIG. 18 or the like at the destination to manufacture the plurality of semiconductor devices 2D.

According to this modification, it is possible to manufacture the semiconductor device 2D in which the semiconductor element 40 is flip-chip bonded on the unit substrate 30D.

Fifth Modification of First Embodiment

In a fifth modification of the first embodiment, the substrate for semiconductor elements is not provided with the frame part and the support bars. When describing the fifth modification of the first embodiment, a description of those parts that are the same as those corresponding parts of the first embodiment and the modifications thereof may be omitted.

Figure 19A:
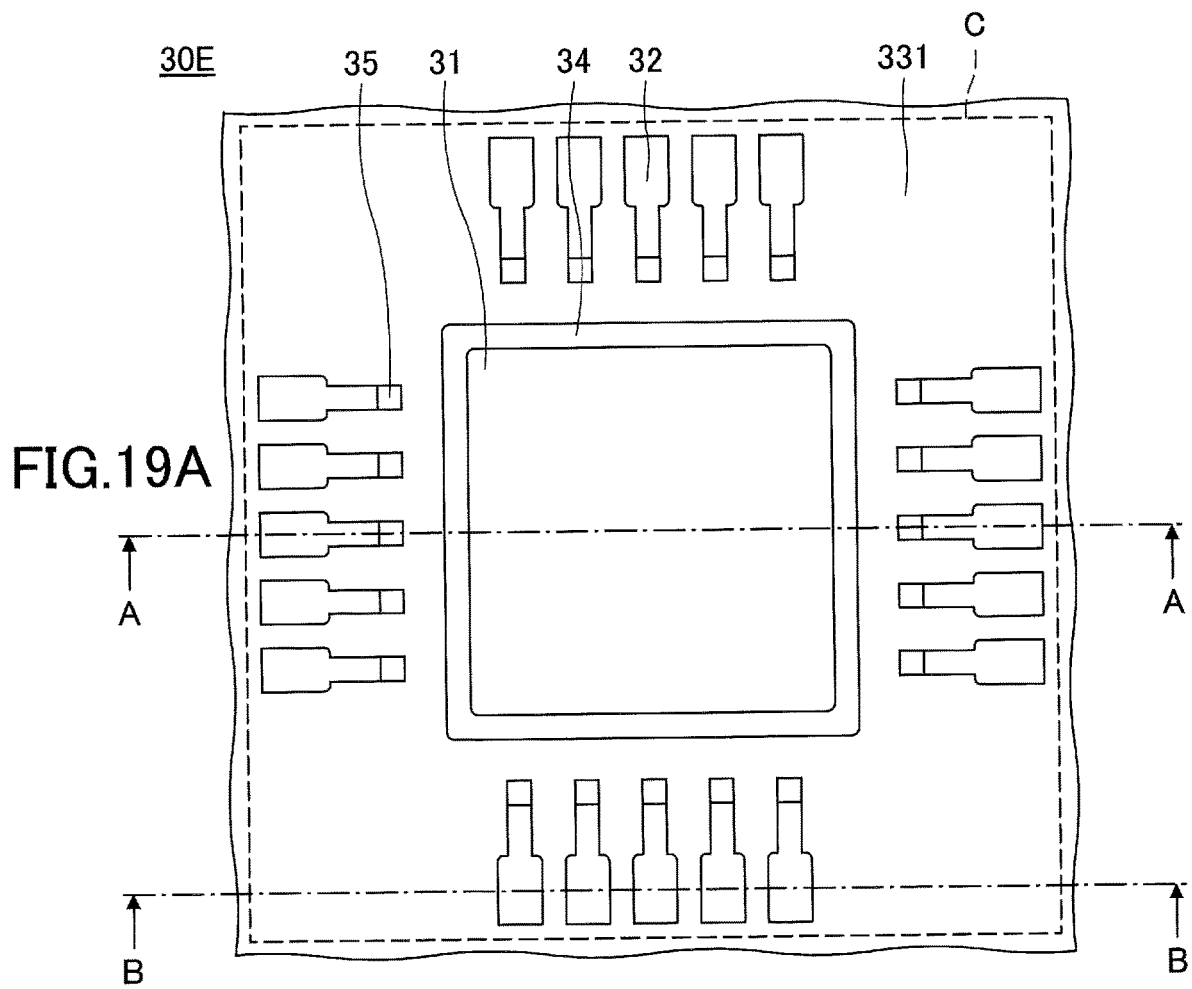
FIG. 19A, FIG. 19B, and FIG. 19C are diagrams illustrating an example of the unit substrate forming the substrate for semiconductor elements in a fifth modification of the first embodiment.
Figure 19B:
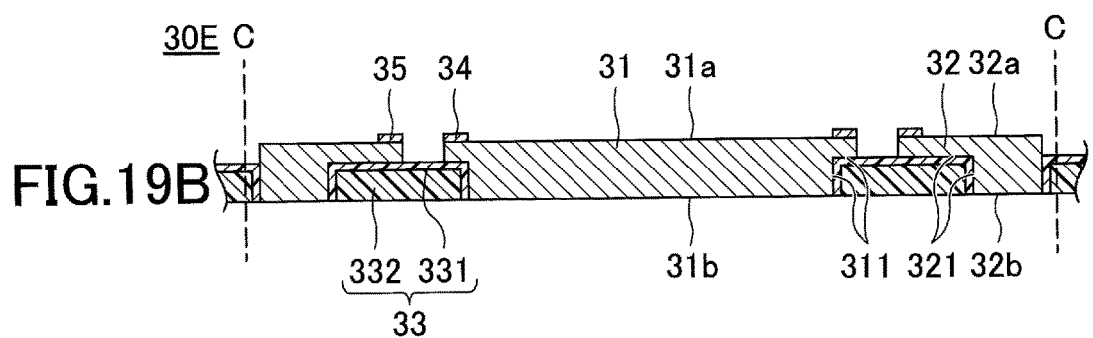
Figure 19C:
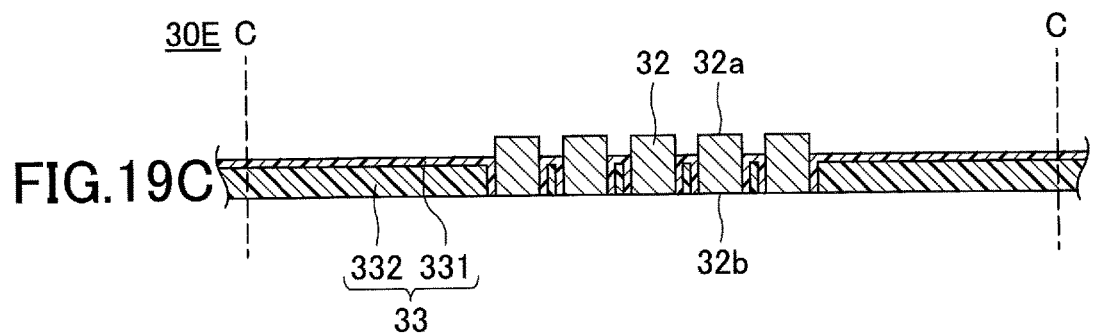

FIG. 19A through FIG. 19C are diagrams illustrating an example of the unit substrate forming the substrate for semiconductor elements in the fifth modification of the first embodiment. FIG. 19A illustrates a plan view, FIG. 19B illustrates a cross section along a line A-A in FIG. 19A, and FIG. 19C illustrates a cross section along a line B-B in FIG. 19A.

As illustrated in FIG. 19A through FIG. 19C, a unit substrate 30E differs from the unit substrate 30 illustrated in FIG. 2A through FIG. 2C, in that the unit substrate 30E is not provided with the frame part 38 and the support bars 39.

FIG. 20A, FIG. 20B, FIG. 20C, and FIG. 20D are diagrams illustrating examples of manufacturing processes of the substrate for semiconductor elements in the fifth modification of the first embodiment. FIG. 20A through FIG. 20D illustrate cross sections corresponding to the cross section illustrated in FIG. 19B. When manufacturing the substrate 1 for semiconductor elements, in which the unit substrates 30E are arranged in the matrix arrangement, processes similar to the processes of the first embodiment described in conjunction with FIG. 4A through FIG. 4E are performed. Then, without performing the processes described in conjunction with FIG. 5A through FIG. 5D, processes similar to the processes of the first embodiment described in conjunction with FIG. 6A through 6C are performed, to manufacture a stacked structure illustrated in FIG. 20A. The metal layers 34 and 35 may be formed by electroplating using the plate member 10A as the feed path, for example.

Next, in the process illustrated in FIG. 20B, a photoresist 360 is formed on the entire upper surface of the plate member 10A, and a photoresist 370 is formed on the entire lower surface of the metal film 400. For example, the photoresist 360 and the photoresist 370 may be made of a dry film resist or the like. The photoresist 360 is exposed, developed, and patterned so as to expose the regions that are to be etched. In the plan view, the photoresist 360 is patterned so as to cover the regions where the die pad 31 and the leads 32 are provided. In this state, the photoresist 370 still covers the entire lower surface of the metal film 400.

Next, in the process illustrated in FIG. 20C, the plate member 10A is etched using the photoresist 360 and the photoresist 370 as etching masks. Hence, a part of the region forming the bottom of the cavity part 10y of the plate member 10A is removed, and the die pad 31 and the leads 32 having the planar shape illustrated in FIG. 19A are formed. In this state, the cutout part 311 is provided in the lower surface 31b of the die pad 31, and separates the cavity part 10y. In addition, the cutout part 321 is provided in the lower surface 32b of the lead 32, in the region of the lead 32 opposing the die pad 31, and separates the cavity part 10y.

In the case in which the plate member 10A is made of copper, the die pad 31 including the cutout part 311, and the leads 32 including the cutout part 321, the frame part 38 may be formed by the wet etching using the cupric chloride solution, for example. Parts corresponding to the frame part 38 and the support bars 39 illustrated in FIG. 2A through FIG. 2C are also etched, so that the die pad 31 and the leads 32 are supported solely by the resin part 33.

Next, in the process illustrated in FIG. 20D, the resist 360 and the resist 370 illustrated in FIG. 20C are removed. After the process illustrated in FIG. 20D, the metal film 400 is removed by a process similar to the process described in conjunction with FIG. 5D. Then, the resin part 33 formed below the lower surface 31*b* of the die pad 31 and the lower surfaces 32*b* of the leads 32 is removed, to expose the lower surface 31*b* of the die pad 31 and the lower surfaces 32*b* of the leads 32, and complete the substrate 1 for semiconductor elements illustrated in FIG. 1 in which the unit substrates 30E are arranged in the matrix arrangement.

Figure 21A:
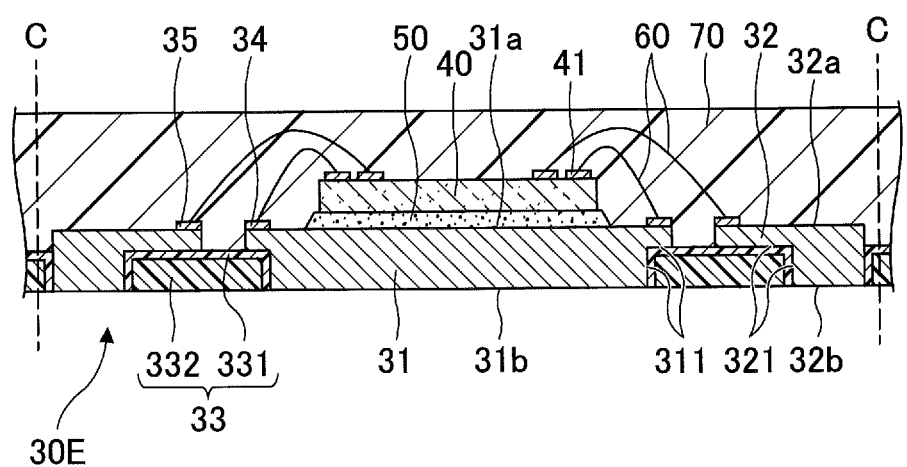
FIG. 21A and FIG. 21B are diagrams illustrating examples of manufacturing processes of the semiconductor device in the fifth modification of the first embodiment.

The manufacturing process of the semiconductor device, including mounting of the semiconductor element on the unit substrate 30E, will now be described, by referring to FIG. 21A and FIG. 21B. First, processes similar to the processes of the first embodiment described in conjunction with FIG. 7A through 7C are performed, except that the unit substrate 30E is used in place of the unit substrate 30, to manufacture a stacked structure illustrated in FIG. 21A.

Figure 21B:
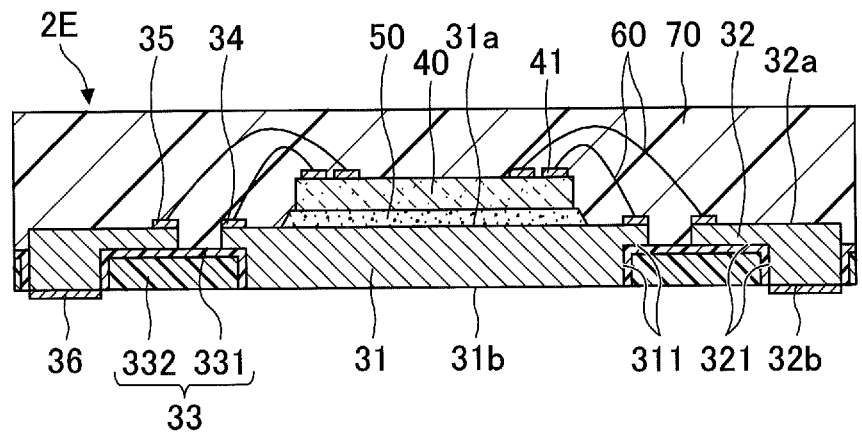

In the process illustrated in FIG. 21B, the metal layer 36 for external connection is formed on the lower surfaces 32*b* of the leads 32, and the unit substrates 30E are thereafter cut at the cutting positions C into the individual pieces, to complete a plurality of semiconductor devices 2E, similarly to the process described in conjunction with FIG. 7D. The metal layer 36 may be formed by electroplating, for example. In the semiconductor device 2E, the lower part of the side surfaces of the leads 32 are covered by the resin part 33, and the upper part of the side surfaces of the leads 32 are covered by the encapsulating resin 70. Thus, the side surfaces of the leads 32 are not exposed to the outside.

The semiconductor device 2E may be delivered as one product. Alternatively, the substrate 1 for semiconductor elements, in the state before being cut into the individual pieces, and including the unit substrates 30E illustrated in FIG. 19A through FIG. 19C, may be delivered as one product. In the latter case, the substrate 1 for semiconductor elements, delivered to the destination as one product, may be subjected to processes including the process described above in conjunction with FIG. 18 at the destination to manufacture the plurality of semiconductor devices 2E.

The unit substrate does not need to be provided with the frame part and the support bars, as in the case of this modification. In this case, the substrate 1 for semiconductor elements can be manufactured satisfactorily, because the die pad 31 and the leads 32 can be supported by the resin part 33.

Sixth Modification of First Embodiment

A sixth modification of the first embodiment is another example in which the substrate for semiconductor elements is not provided with the frame part and the support bars. When describing the sixth modification of the first embodiment, a description of those parts that are the same as those corresponding parts of the first embodiment and the modifications thereof may be omitted.

Figure 22A:
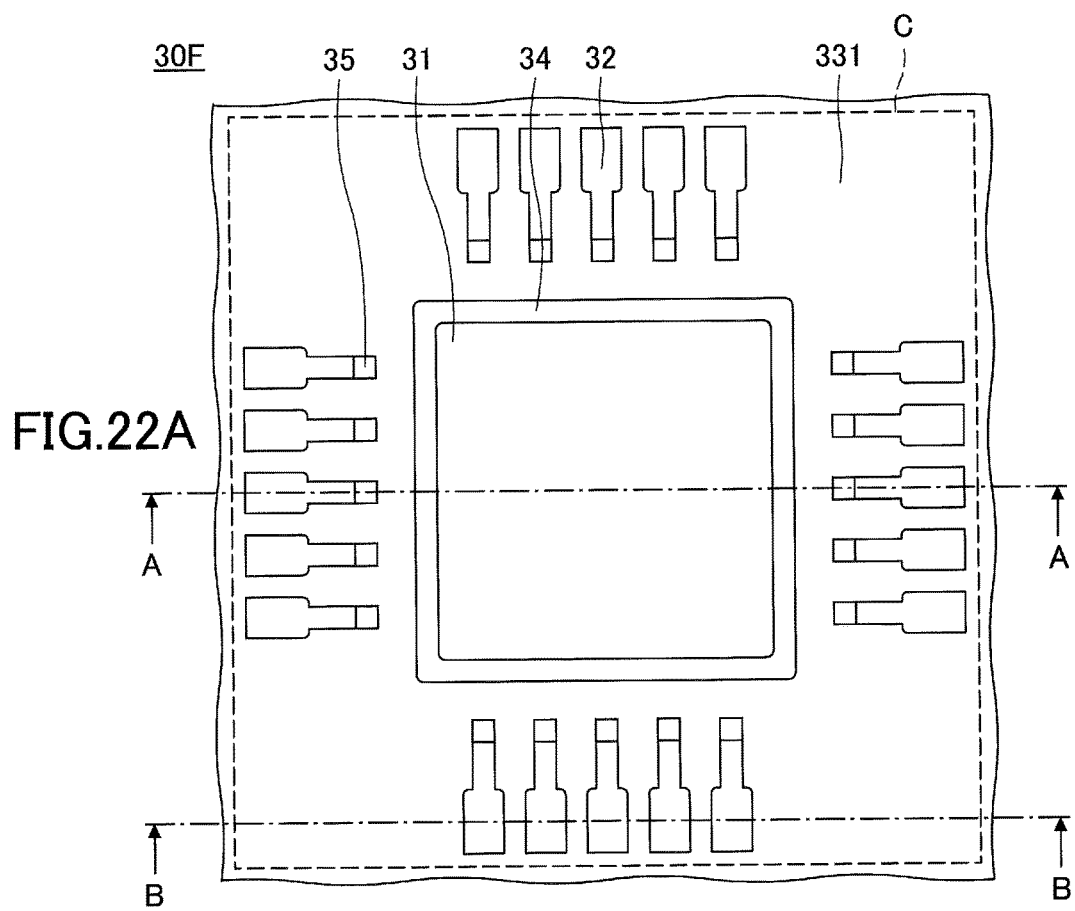
FIG. 22A, FIG. 22B, and FIG. 22C are diagrams illustrating an example of the unit substrate forming the substrate for semiconductor elements in a sixth modification of the first embodiment.
Figure 22B:
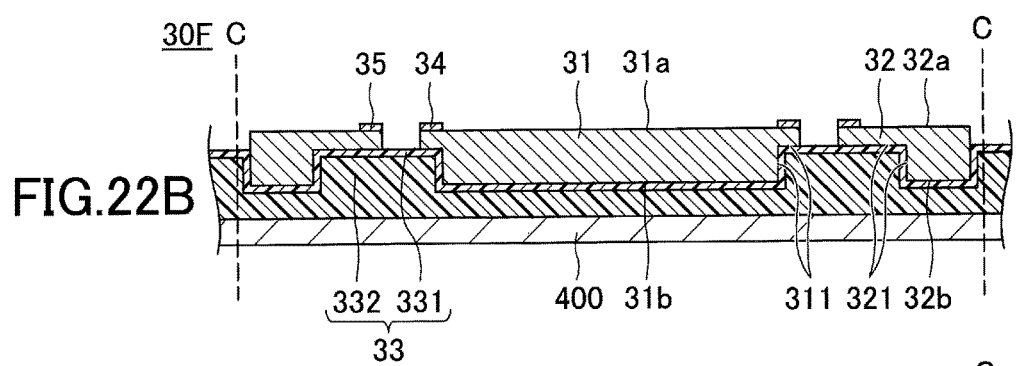
Figure 22C:
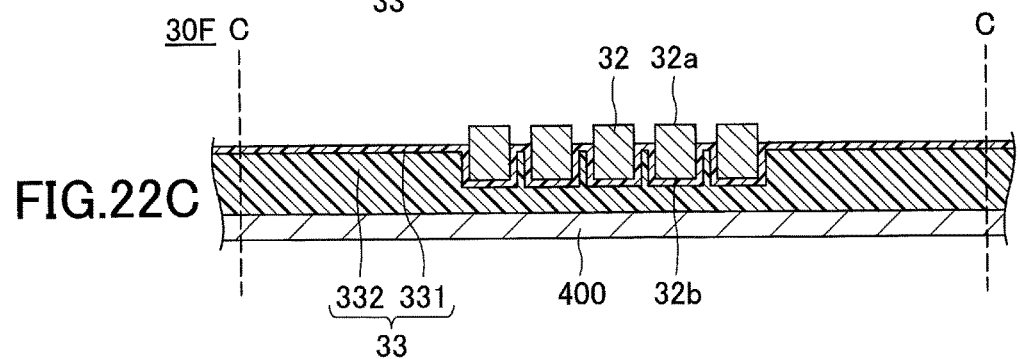

FIG. 22A through FIG. 22C are diagrams illustrating an example of the unit substrate forming the substrate for semiconductor elements in the sixth modification of the first embodiment. FIG. 22A illustrates a plan view, FIG. 22B illustrates a cross section along a line A-A in FIG. 22A, and FIG. 22C illustrates a cross section along a line B-B in FIG. 22A.

As illustrated in FIG. 22A through FIG. 22C, a unit substrate 30F differs from the unit substrate 30A illustrated in FIG. 8A through FIG. 8C, in that the unit substrate 30F is not provided with the frame part 38 and the support bars 39.

The unit substrate 30F may be manufactured by the processes of the fifth modification of the first embodiment described in conjunction with FIG. 20A through FIG. 20D. In this modification, however, the process illustrated in FIG. 20D becomes a last process, and there is no process of removing the metal film 400 and the resin part 33 after the process illustrated in FIG. 20D.

Figure 23A:
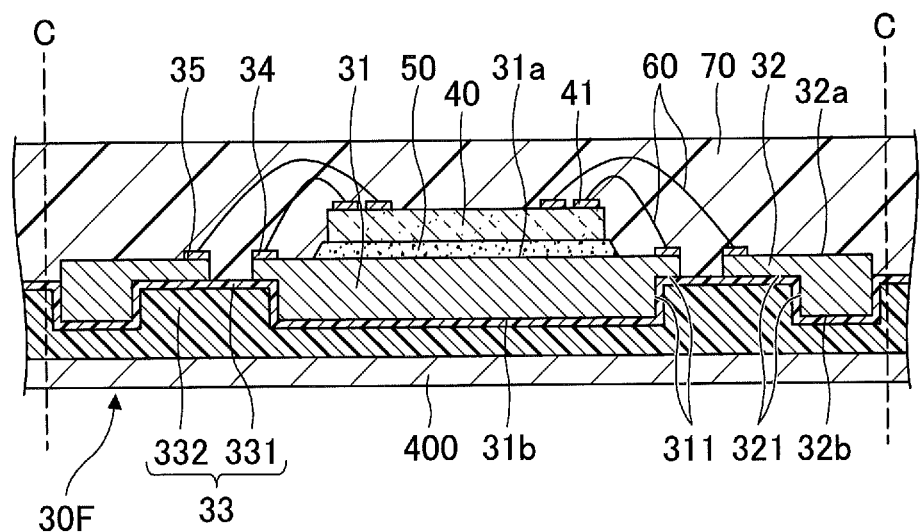
FIG. 23A, FIG. 23B, and FIG. 23C are diagrams illustrating examples of manufacturing processes of the semiconductor device in the sixth modification of the first embodiment.
Figure 23B:
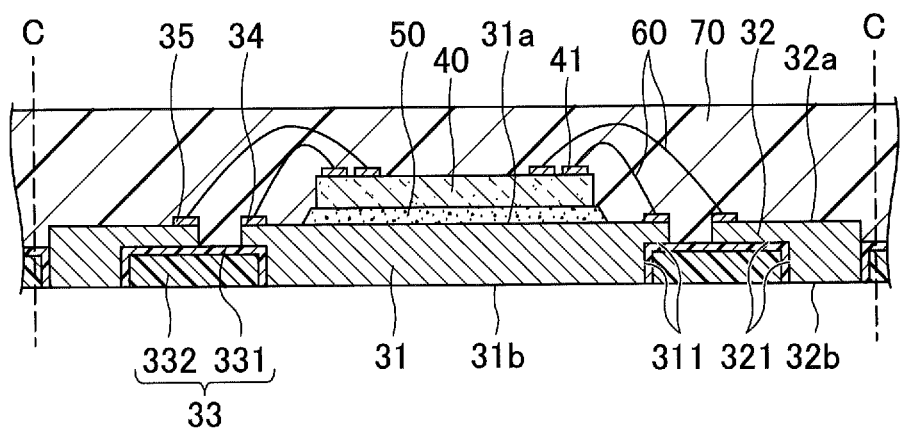
Figure 23C:
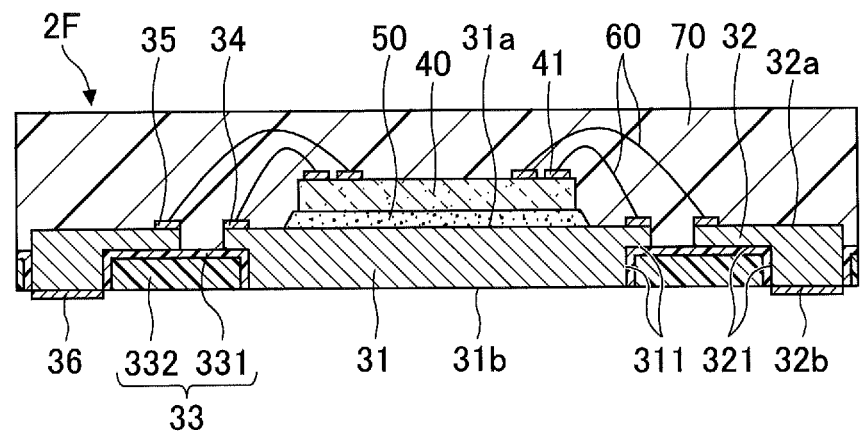

The manufacturing process of the semiconductor device, including mounting of the semiconductor element on the unit substrate 30F, will now be described, by referring to FIG. 23A through FIG. 23C. FIG. 23A, FIG. 23B, and FIG. 23C are diagrams illustrating examples of manufacturing processes of the semiconductor device in the sixth modification of the first embodiment. First, processes similar to the processes of the first embodiment described in conjunction with FIG. 7A through 7C are performed, except that the unit substrate 30F is used in place of the unit substrate 30, to manufacture a stacked structure illustrated in FIG. 23A.

In the process illustrated in FIG. 23B, the metal film 400 is removed by a process similar to the process described in conjunction with FIG. 5D. Then, the resin part 33 formed below the lower surface 31*b* of the die pad 31 and the lower surfaces 32*b* of the leads 32 is removed, to expose the lower surface 31*b* of the die pad 31 and the lower surfaces 32*b* of the leads 32. For example, the lower surface of the resin part 33, from which unwanted parts are removed, is located on the same plane as the lower surface 31*b* of the die pad 31 and the lower surfaces 32*b* of the leads 32.

Next, in the process illustrated in FIG. 23C, the metal layer 36 for external connection is formed on the lower surfaces 32*b* of the leads 32, and the unit substrates 30F are thereafter cut at the cutting positions C into the individual pieces, to complete a plurality of semiconductor devices 2F, similarly to the process described in conjunction with FIG. 7D. The semiconductor device 2F has the same structure as the semiconductor device 2E. The metal layer 36 may be formed by electroplating, for example. In the semiconductor device 2F, the lower part of the side surfaces of the leads 32 are covered by the resin part 33, and the upper part of the side surfaces of the leads 32 are covered by the encapsulating resin 70. Thus, the side surfaces of the leads 32 are not exposed to the outside.

The semiconductor device 2F may be delivered as one product. Alternatively, the substrate 1 for semiconductor elements, in the state before being cut into the individual pieces, and including the unit substrates 30F illustrated in FIG. 22A through FIG. 22C, may be delivered as one product. In the latter case, the substrate 1 for semiconductor elements, delivered to the destination as one product, may be subjected to each of the processes described above in conjunction with FIG. 23A through FIG. 23C at the destination to manufacture the plurality of semiconductor devices 2F.

The unit substrate does not need to be provided with the frame part and the support bars, as in the case of this modification. In this case, the substrate 1 for semiconductor elements can be manufactured satisfactorily, because the die pad 31 and the leads 32 can be supported by the resin part 33. In addition, by maintaining the metal film 400 on the unit substrate 30F until the latter stages of the manufacturing process of the semiconductor device 2F, it is possible to improve the rigidity or strength of the product during the manufacturing process, to enable a stable process to be performed at each stage of the manufacturing process.

Second Embodiment

In a second embodiment, the unit substrate 30C of the third modification of the first embodiment has a structure similar to that of the fifth or sixth modification of the first embodiment, including no frame part and no support bars. In this embodiment, the semiconductor element can be flip-chip bonded to the unit substrate having no frame part and no support bars.

Third Embodiment

In a third embodiment, the unit substrate 30D of the fourth modification of the first embodiment has a structure similar to that of the fifth or sixth modification of the first embodiment, including no frame part.

Fourth Embodiment

In a fourth embodiment, the substrate 1 for semiconductor elements in any of the third through sixth modifications of the first embodiment is additionally provided with the other resin part of the second modification of the first embodiment.

Although the embodiments and the modifications are numbered with, for example, "first," "second," or "third," etc., the ordinal numbers do not imply priorities of the embodiments. Many other variations and modifications will be apparent to those skilled in the art.

According to the embodiments and the modifications, it is possible to improve the adhesion between the resin and the metal in the substrate for semiconductor elements, and to reduce warping of the substrate for semiconductor elements.

Various aspects of the subject matter described herein may be set out non-exhaustively in the following numbered clauses:

1. A method of manufacturing a substrate for semiconductor elements, comprising:

half-etching a metal plate having one surface and an opposite surface opposite to the one surface, to form a cavity part that caves in from the opposite surface toward the one surface;

arranging a resin part having a multi-layer structure including a first resin and a second resin that are in a semi-cured state, so that the first resin opposes the opposite surface of the metal plate, and adhering the resin part to the opposite surface of the metal plate to fill a bottom part of the cavity part with the resin part; and forming a terminal part having a first surface, a second surface opposite to the first surface, and side surfaces by curing the resin part and thereafter partially removing the resin part in a region forming the bottom part of the cavity part in the metal plate, wherein the forming forms the terminal part so that the first surface is exposed from the resin part, the side surfaces are covered by the resin part, and the first resin contacts the side surfaces of the terminal part, and wherein the first resin and the second resin include a filler, and an amount of the filler included in the first resin is smaller than an amount of the filler included in the second resin.

2. The method of manufacturing the substrate for semiconductor elements according to clause 1, further comprising:

preparing the resin part including the second resin and the first resin that are in the semi-cured state and are successively stacked on one of a metal film and a support film.

3. The method of manufacturing the substrate for semiconductor elements according to clause 1 or 2, wherein the forming forms a semiconductor element mounting part together with the terminal part, and further comprising:

forming a first cutout part in the other surface at an outer peripheral part of the semiconductor element mounting part, and separating the cavity part; and forming a second cutout part in the second surface at an end part of the terminal part, facing the outer peripheral part of the semiconductor element mounting part, and separating the cavity part.

4. The method of manufacturing the substrate for semiconductor elements according to clause 3, further comprising:

arranging another resin part having a multi-layer structure including a third resin and a fourth resin, so that the third resin opposes one surface of the semiconductor element mounting part and the first surface of the terminal part, and adhering the third resin to the one surface of the semiconductor element mounting part and the first surface of the terminal part, to fill a region on the resin part where the semiconductor element mounting part and the terminal part are not provided with the other resin part; and removing the other resin part formed above the one surface of the semiconductor element mounting part and the first surface of the terminal part, to expose the one surface of the semiconductor element mounting part and the first surface of the terminal part.

5. The method of manufacturing the substrate for semiconductor elements according to clause 3 or 4, further comprising:

after forming the semiconductor element mounting part together with the terminal part, removing the resin part below the other surface of the semiconductor element mounting part and the second surface of the terminal part, to expose the other surface of the semiconductor element mounting part and the second surface of the terminal part.

6. A method of manufacturing a semiconductor device, comprising:

forming the substrate for semiconductor elements according to any of clauses 1 to 5;

mounting a semiconductor element on one surface of the substrate for semiconductor elements;

forming an encapsulating resin on the one surface of the substrate for semiconductor elements, to encapsulate the semiconductor element; and removing the resin part formed below the second surface of the terminal part, to expose the second surface of the terminal part.

The description above use terms such as "determine", or the like to describe the embodiments, however, such terms are abstractions of the actual operations that are performed. Hence, the actual operations that correspond to such taws may vary depending on the implementation, as is obvious to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate for semiconductor elements, comprising:
a plurality of leads respectively including a first surface, a second surface opposite to the first surface, side surfaces joining the first surface and the second surface, a first end, and a second end opposite to the first end;
a cutout part provided in the second surface at the first end of each of the plurality of leads;
an external connection part provided on the second surface at the second end of each of the plurality of leads, wherein each of the plurality of leads has a first thickness at the cutout part thinner than a second thickness at the external connection part; and
a resin part covering the side surfaces and exposing the first surface of each of the plurality of leads, and filling an inside of the cutout part,
wherein the resin part has a multi-layer structure, including a first resin and a second resin, and having the first resin laminated on the second resin,
wherein the first resin is provided in contact with the side surfaces of each of the plurality of leads and an inner wall surface of the cutout part,
wherein the first resin and the second resin include a filler, and
wherein an amount of the filler included in the first resin is smaller than an amount of the filler included in the second resin.

2. The substrate for semiconductor elements as claimed in claim 1, further comprising:
a semiconductor element mounting part including a third surface on which a semiconductor element is mounted, a fourth surface opposite to the third surface, and a first cutout part provided in the fourth surface at an outer peripheral part of the semiconductor element mounting part,
wherein each of the plurality of leads is arranged at a position separated from the semiconductor element mounting part, and includes a second cutout part provided in the second surface at the first end of each of the plurality of leads facing the outer peripheral part of the semiconductor element mounting part,
wherein the resin part holds the semiconductor element mounting part and the plurality of leads in a state in which the third surface of the semiconductor element mounting part and the first surface of each of the plurality of leads are exposed, and fills the first cutout part and the second cutout part, and
wherein the first resin is arranged to make contact with inner wall surfaces of the first cutout part and inner wall surfaces of the second cutout part.

3. The substrate for semiconductor elements as claimed in claim 2, wherein
the first resin extends from inside the first cutout part toward a part of a side surface of the semiconductor element mounting part, to directly cover the part of the side surface of the semiconductor element mounting part, and also extends from inside the second cutout part toward a part of the side surfaces of each of the of leads, to directly cover the part of the side surfaces of each of the plurality of leads, and
the second resin is arranged to stretch over the first resin that extends from inside the first cutout part toward the part of the side surface of the semiconductor element mounting part, to directly cover the part of the side surface of the semiconductor element mounting part, and is also arranged to stretch over the first resin that extends from inside the second cutout part toward the part of the side surfaces of each of the plurality of leads, to directly cover the part of the side surfaces of each of the plurality of leads.

4. The substrate for semiconductor elements as claimed in claim 3, further comprising:
another resin part provided on a surface of the resin part so as to fill regions where the semiconductor element mounting part and the plurality of leads are not provided,
wherein the third surface of the semiconductor element mounting part and the first surface of each of the plurality of leads project from the surface of the resin part,
wherein the other resin part has a multi-layer structure including a third resin and a fourth resin,
wherein the third resin is arranged to make contact with side surfaces of the semiconductor element mounting part exposed from the resin part, the side surfaces of each of the plurality of leads exposed from the resin part, an end surface of each of the plurality of leads opposing the semiconductor element mounting part and exposed from the resin part, and a surface of the first resin,
wherein the fourth resin is arranged to sandwich the third resin between the fourth resin and each of the side surfaces of the semiconductor element mounting part exposed from the resin part, the side surfaces of each of the plurality of leads exposed from the resin part, the end surface of each of the plurality of leads opposing the semiconductor element mounting part and exposed from the resin part, and the surface of the first resin,
wherein the third resin and the fourth resin include a filler, and
wherein an amount of the filler included in the third resin is smaller than an amount of the filler included in the fourth resin.

5. The substrate for semiconductor elements as claimed in claim 2, wherein the resin part exposes the fourth surface of the semiconductor element mounting part and the second surface of each of the plurality of leads.

6. The substrate for semiconductor elements as claimed in claim 2, wherein
the second resin is formed on one of a metal film and a support film, and the first resin is formed on the second resin,
the first resin extends from inside the first cutout part to the fourth surface of the semiconductor element mounting part, to directly cover the fourth surface of the semiconductor element mounting part, and also extends from inside the second cutout part to the second surface of each of the plurality of leads, to directly cover the second surface of each of the plurality of leads, and
the second resin extends on the first resin that extends from inside the first cutout part to the fourth surface of the semiconductor element mounting part to directly cover the fourth surface of the semiconductor element mounting part, and also extends on the first resin that extends from inside the second cutout part to the second surface of each of the plurality of leads to directly cover the second surface of each of the plurality of leads.

7. The substrate for semiconductor elements as claimed in claim 2, wherein the plurality of leads are provided at a plurality of locations with respect to the semiconductor element mounting part.

8. The substrate for semiconductor elements as claimed in claim 7, wherein the semiconductor element mounting part is provided in a plurality of regions on the substrate for semiconductor elements.

9. The substrate for semiconductor elements as claimed in claim 8, wherein
the semiconductor element mounting part is provided in each of the plurality of regions that are arranged in a matrix arrangement on the substrate for semiconductor elements, and
the plurality of regions of the substrate for semiconductor elements are cuttable into individual pieces that form a plurality of unit substrates respectively including the semiconductor element.

10. A semiconductor device comprising:
a substrate for semiconductor elements that includes
a plurality of leads respectively including a first surface, a second surface opposite to the first surface, side surfaces joining the first surface and the second surface, a first end, and a second end opposite to the first end,
a cutout part provided in the second surface at the first end of each of the plurality of leads,
an external connection part provided on the second surface at the second end of each of the plurality of leads, wherein each of the plurality of leads has a first thickness at the cutout part thinner than a second thickness at the external connection part, and
a resin part covering the side surfaces of each of the plurality of leads and exposing the external connection part and the first surface of each of the plurality of leads,
wherein the resin part has a multi-layer structure, including a first resin and a second resin, and having the first resin laminated on the second resin,
wherein the first resin is provided in contact with the side surfaces of each of the plurality of leads and an inner wall surface of the cutout part,
the first resin and the second resin include a filler, and an amount of the filler included in the first resin is smaller than an amount of the filler included in the second resin; and
a semiconductor element mounted on the substrate for semiconductor elements,
wherein the semiconductor element and the plurality of leads are electrically connected.

11. The semiconductor device as claimed in claim 10, wherein the substrate for semiconductor elements further includes a semiconductor element mounting part including a third surface on which the semiconductor element is mounted, a fourth surface opposite to the third surface, and a first cutout part provided in the fourth surface at an outer peripheral part of the semiconductor element mounting part,
wherein each of the plurality of leads is arranged at a position separated from the semiconductor element mounting part, and includes a second cutout part provided in the second surface at the first end of each of the plurality of leads facing the outer peripheral part of the semiconductor element mounting part,
wherein the resin part holds the semiconductor element mounting part and the plurality of leads in a state in which the third surface of the semiconductor element mounting part and the first surface of each of the plurality of leads are exposed, and fills the first cutout part and the second cutout part, and
wherein the first resin is arranged to make contact with inner wall surfaces of the first cutout part and inner wall surfaces of the second cutout part.

12. The semiconductor device as claimed in claim 11, wherein the first resin extends from inside the first cutout part toward a part of a side surface of the semiconductor element mounting part, to directly cover the part of the side surface of the semiconductor element mounting part, and also extends from inside the second cutout part toward a part of the side surfaces of each of the plurality of leads, to directly cover the part of the side surfaces of each of the plurality of leads, and
the second resin is arranged to stretch over the first resin that extends from inside the first cutout part toward the part of the side surface of the semiconductor element mounting part, to directly cover the part of the side surface of the semiconductor element mounting part, and is also arranged to stretch over the first resin that extends from inside the second cutout part toward the part of the side surfaces of each of the plurality of leads, to directly cover the part of the side surfaces of each of the plurality of leads.

13. The semiconductor device as claimed in claim 12, wherein the substrate for semiconductor elements further includes
another resin part provided on a surface of the resin part so as to fill regions where the semiconductor element mounting part and the plurality of leads are not provided,
wherein the third surface of the semiconductor element mounting part and the first surface of each of the plurality of leads project from the surface of the resin part,
wherein the other resin part has a multi-layer structure including a third resin and a fourth resin,
wherein the third resin is arranged to make contact with side surfaces of the semiconductor element mounting part exposed from the resin part, the side surfaces of each of the plurality of leads exposed from the resin part, an end surface of each of the plurality of leads opposing the semiconductor element mounting part and exposed from the resin part, and a surface of the first resin,
wherein the fourth resin is arranged to sandwich the third resin between the fourth resin and each of the side surfaces of the semiconductor element mounting part exposed from the resin part, the side surfaces of each of the plurality of leads exposed from the resin part, the end surface of each of the plurality of leads opposing the semiconductor element mounting part and exposed from the resin part, and the surface of the first resin,
wherein the third resin and the fourth resin include a filler, and
wherein an amount of the filler included in the third resin is smaller than an amount of the filler included in the fourth resin.

14. The semiconductor device as claimed in claim 11, wherein the resin part exposes the fourth surface of the semiconductor element mounting part and the second surface of each of the plurality of leads.

15. The semiconductor device as claimed in claim 11, wherein
the second resin is formed on one of a metal film and a support film, and the first resin is formed on the second resin,
the first resin extends from inside the first cutout part to the fourth surface of the semiconductor element mounting part, to directly cover the fourth surface of the semiconductor element mounting part, and also extends from inside the second cutout part to the second surface of each of the plurality of leads, to directly cover the second surface of each of the plurality of leads, and the second resin extends on the first resin that extends from inside the first cutout part to the fourth surface of the semiconductor element mounting part to directly cover the fourth surface of the semiconductor element mounting part, and also extends on the first resin that extends from inside the second cutout part to the second surface of each of the plurality of leads to directly cover the second surface of each of the plurality of leads.

16. The semiconductor device as claimed in claim 11, wherein the semiconductor element mounting part is provided in each of a plurality of regions that are arranged in a matrix arrangement on the substrate for semiconductor elements, and the plurality of regions of the substrate for semiconductor elements are cuttable into individual pieces that form a plurality of unit substrates respectively including the semiconductor element.

17. The semiconductor device as claimed in claim 10, further comprising:

a plurality of metal wires configured to electrically connect the semiconductor element and the plurality of leads.

18. The semiconductor device as claimed in claim 10, further comprising:

a plurality of solder bumps configured to electrically connect the semiconductor element and the plurality of leads.

19. The semiconductor device as claimed in claim 10, further comprising:

an encapsulating resin provided on a surface of the substrate for semiconductor elements, wherein the encapsulating resin encapsulates the semiconductor element.

20. The semiconductor device as claimed in claim 17, further comprising:

an encapsulating resin provided on a surface of the substrate for semiconductor elements, wherein the encapsulating resin encapsulates each of the semiconductor element and the plurality of metal wires.

* * * * *